United States Patent
Wen et al.

(10) Patent No.: US 10,921,123 B2
(45) Date of Patent: Feb. 16, 2021

(54) PITCH/ROLL ANNULUS GYROSCOPE WITH SLANTED QUADRATURE TUNING ELECTRODES AND RELATED FABRICATION METHODS

(71) Applicant: Georgia Tech Research Corporation, Atlanta, GA (US)

(72) Inventors: Haoran Wen, Atlanta, GA (US); Farrokh Ayazi, Atlanta, GA (US); Anosh Daruwalla, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 254 days.

(21) Appl. No.: 16/307,169

(22) PCT Filed: Jun. 7, 2017

(86) PCT No.: PCT/US2017/036329
§ 371 (c)(1),
(2) Date: Dec. 5, 2018

(87) PCT Pub. No.: WO2018/057071
PCT Pub. Date: Mar. 29, 2018

(65) Prior Publication Data
US 2019/0137271 A1 May 9, 2019

Related U.S. Application Data

(63) Continuation-in-part of application No. PCT/US2016/059408, filed on Oct. 28, 2016.
(Continued)

(51) Int. Cl.
*G01C 19/5698* (2012.01)
*H03H 9/02* (2006.01)
(Continued)

(52) U.S. Cl.
CPC ........ *G01C 19/5698* (2013.01); *H03H 3/007* (2013.01); *H03H 3/0072* (2013.01);
(Continued)

(58) Field of Classification Search
CPC .......... G01C 19/5698; H03H 9/02259; H03H 9/2431; H03H 3/007; H03H 3/0072;
(Continued)

(56) References Cited

U.S. PATENT DOCUMENTS 5,548,178 A    8/1996   Eda et al.
6,889,550 B2   5/2005   Beitia
(Continued)

FOREIGN PATENT DOCUMENTS

WO   2015/063727   5/2015
WO   2016/201413   12/2016
WO   2017/075413   5/2017

OTHER PUBLICATIONS

Notification of Transmittal of the International Search Report and the Written Opinion of the International Searching Authority, or the Declaration, in corresponding PCT Application No. PCT/US2017/036329 (9 pages) (dated Feb. 20, 2018).
(Continued)

*Primary Examiner* — Robert R Raevis
(74) *Attorney, Agent, or Firm* — Myers Bigel, P.A.

(57) ABSTRACT

A bulk acoustic wave resonator apparatus includes a resonator member having an annulus shape, and at least one anchor structure coupling the resonator member to a substrate. A perimeter of the resonator member is at least partially defined by respective sidewalls that are slanted at an angle relative to a plane defined by a surface of the resonator member. The surface of the resonator member may be defined by a (100) crystal plane, and the angle of the
(Continued)

respective sidewalls may be defined by a (111) crystal plane. Related fabrication methods are also discussed.

20 Claims, 19 Drawing Sheets

Related U.S. Application Data

(60) Provisional application No. 62/349,700, filed on Jun. 14, 2016, provisional application No. 62/346,855, filed on Jun. 7, 2016.

(51) Int. Cl.
  *H03H 9/24* (2006.01)
  *H03H 3/007* (2006.01)

(52) U.S. Cl.
  CPC .... *H03H 9/02259* (2013.01); *H03H 9/02338* (2013.01); *H03H 9/2431* (2013.01); *H03H 2009/02346* (2013.01); *H03H 2009/241* (2013.01)

(58) Field of Classification Search
  CPC ..... H03H 9/02338; H03H 2009/02346; H03H 2009/241; H03H 2009/02283; H03H 9/02535; H03H 9/02543; H03H 9/02551; H03H 9/02039; H03H 2003/0414
  USPC ......... 73/1.38, 1.77, 504.12, 504.13, 504.29; 331/44, 64, 65, 66, 158–164, 187
  See application file for complete search history.

(56) References Cited

U.S. PATENT DOCUMENTS

| | | | |
|---|---|---|---|
| 8,166,816 B2 | 5/2012 | Ayazi et al. | |
| 8,763,441 B2 | 7/2014 | Casinovi et al. | |
| 2002/0083777 A1 | 7/2002 | Mochida | |
| 2002/0180563 A1 | 12/2002 | Ma et al. | |
| 2005/0248238 A1 | 11/2005 | Yamada et al. | |
| 2006/0091978 A1 | 5/2006 | Wang et al. | |
| 2006/0225504 A1 | 10/2006 | Ayazi et al. | |
| 2007/0222011 A1 | 9/2007 | Robert et al. | |
| 2009/0095079 A1 | 4/2009 | Ayazi | |
| 2010/0251818 A1 | 10/2010 | Ge et al. | |
| 2011/0298564 A1* | 12/2011 | Iwashita | H03H 9/173 333/187 |
| 2013/0009716 A1 | 1/2013 | Phan Le | |
| 2013/0283911 A1 | 10/2013 | Ayazi et al. | |
| 2014/0197502 A1 | 7/2014 | Dehe | |
| 2014/0230549 A1 | 8/2014 | McNeil et al. | |
| 2015/0021722 A1 | 1/2015 | Dehe et al. | |
| 2015/0377624 A1 | 12/2015 | Falorni et al. | |
| 2016/0268927 A1 | 9/2016 | Liu et al. | |
| 2016/0327390 A1 | 11/2016 | Serrano et al. | |
| 2017/0067742 A1 | 3/2017 | Zotov et al. | |
| 2017/0170801 A1* | 6/2017 | Tajic | H03H 9/02015 |
| 2018/0321037 A1 | 11/2018 | Wen et al. | |

OTHER PUBLICATIONS

Acar et al. "Post-Release Capacitance Enhancement in Micromachined Devices" Proceedings of IEEE Sensors 2004 1:268-271 (Oct. 2004).

Ayazi et al. "High Aspect-Ratio Combined Poly and Single-Crystal Silicon (HARPSS) MEMS Technology" Journal of Microelectromechanical Systems 9(3):288-294 (Sep. 2000).

Ayazi, Farrokh "Multi-DOF inertial MEMS: From gaming to dead reckoning" 2011 16th International Solid-State Sensors, Actuators and Microsystems Conference (pp. 2805-2808) (Jun. 2011).

Jensen et al. "Shaped Comb Fingers for Tailored Electromechanical Restoring Force" Journal of Microelectromechanical Systems 12(3):373-383 (Jun. 2003).

Kaajakari et al. "Nonlinear Limits for Single-Crystal Silicon Microresonators" Journal of Microelectromechanical Systems 13(5):715-724 (Oct. 2004).

Pourkamali et al. "Low-impedance VHF and UHF Capacitive Silicon Bulk Acoustic Wave Resonators—Part I: Concept and Fabrication" IEEE Transactions on Electron Devices 54(8):2017-2023 (Aug. 2007).

Pourkamali et al. "Low-Impedance VHF and UHF Capacitive Silicon Bulk Acoustic-Wave Resonators—Part II: Measurement and Characterization" IEEE Transactions on Electron Devices 54(8):2024-2030 (Aug. 2007).

Rosa et al. "Enhanced electrostatic force generation capability of angled comb finger design used in electrostatic comb-drive actuators" Electronics Letters 34(18):1787-1788 (Sep. 1998).

Shahmohammadi et al. "Nonlinearity Reduction in Silicon Resonators by Doping and Re-Orientation" 2013 IEEE 26th International Conference on Micro Electro Mechanical Systems (MEMS) (pp. 793-796) (Jan. 2013).

Shirazi et al. "Combined Phase-Readout and Self-Calibration of MEMS Gyroscopes" 2013 Transducers & Eurosensors XXVII: The 17th International Conference on Solid-State Sensors, Actuators and Microsystems (Transducers & Eurosensors XXVII) (pp. 960-963) (Jun. 2013.

Sung et al. "A mode-matched 0.9 MHZ single proof-mass dual-axis gyroscope" 2011 16th International Solid-State Sensors, Actuators and Microsystems Conference (pp. 2821-2824) (Jun. 2011).

Wen et al. "HARPSS-Fabricated Nano-Gap Comb-Drive for Efficient Linear Actuation of High Frequency BAW Resonators" 2016 IEEE 29th International Conference on Micro Electro Mechanical Systems (MEMS) (pp. 1014-1017) (Jan. 2016).

Yang et al. "Measurement of the Nonlinear Elasticity of Doped Bulk-mode MEMS Resonators" Solid-State Sensors, Actuators and Microsystems Workshop (pp. 285-288) (Jun. 2014).

Ye et al. "Optimal Shape Design of an Electrostatic Comb Drive in Microelectromechanical Systems" Journal of Microelectromechanical Systems 7(1):16-26 (Mar. 1998).

\* cited by examiner

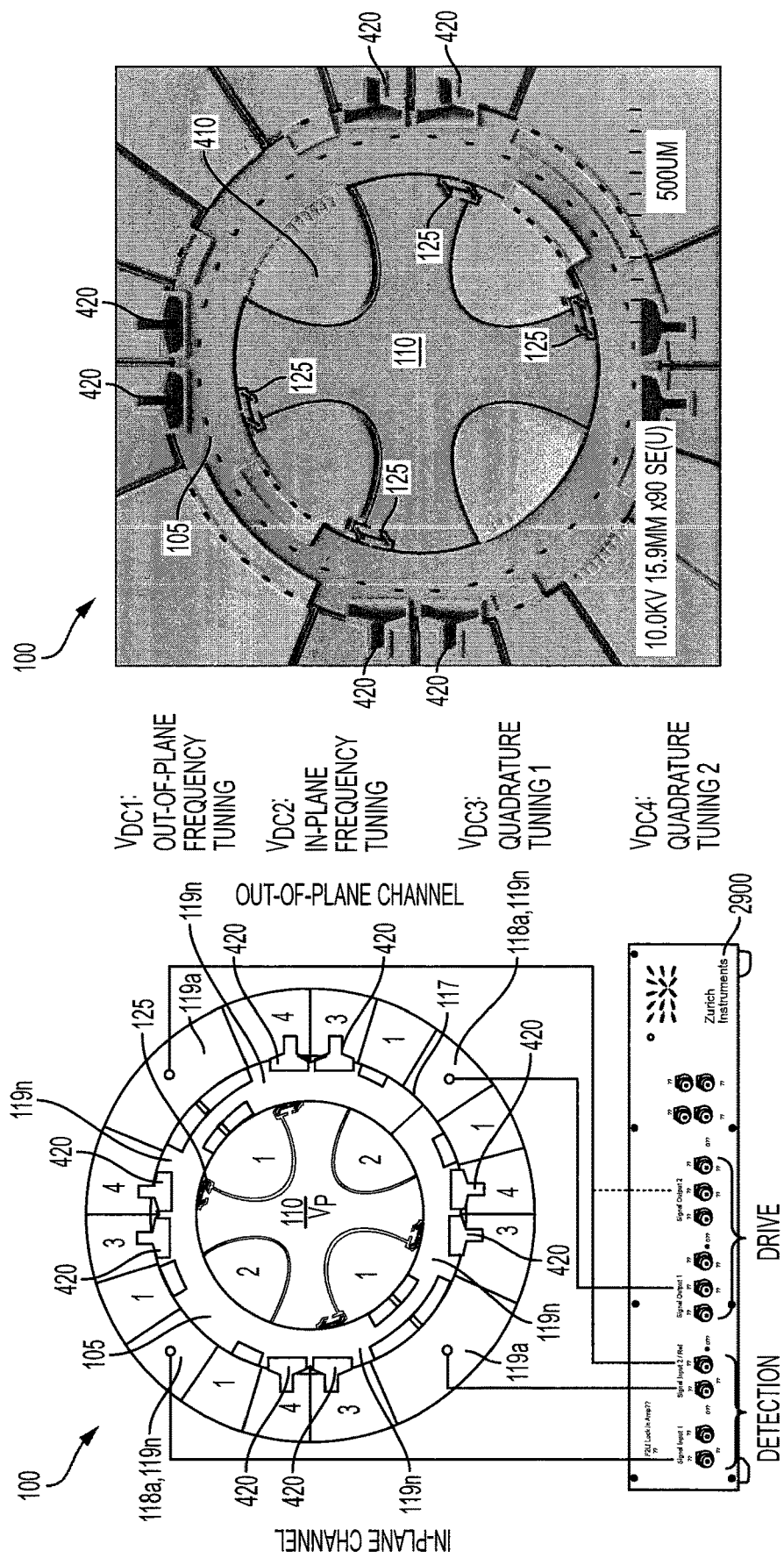

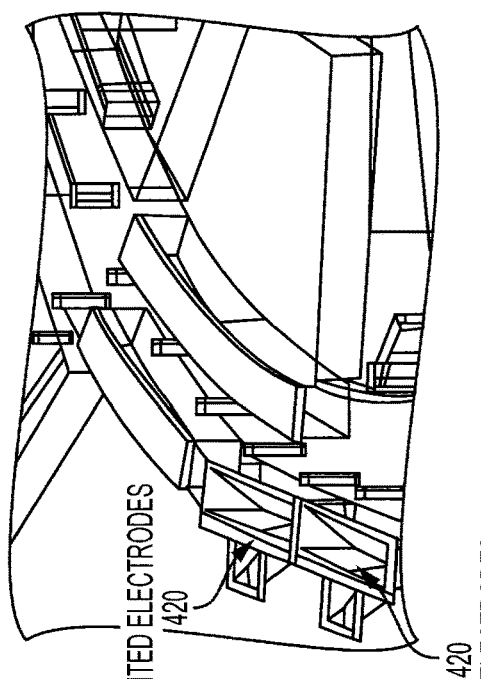
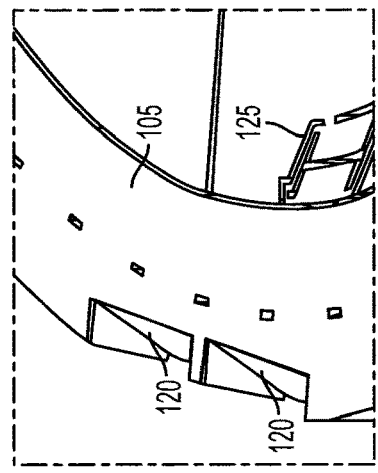
FIG. 3B
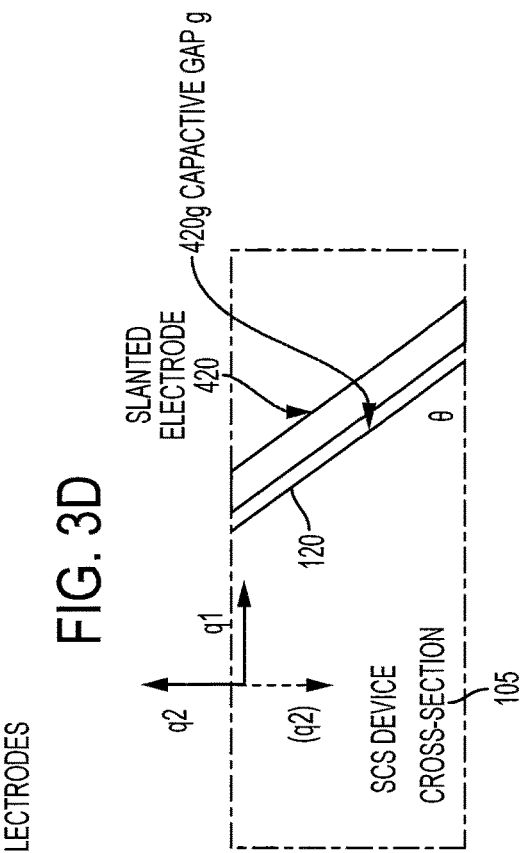
FIG. 3D
FIG. 3C
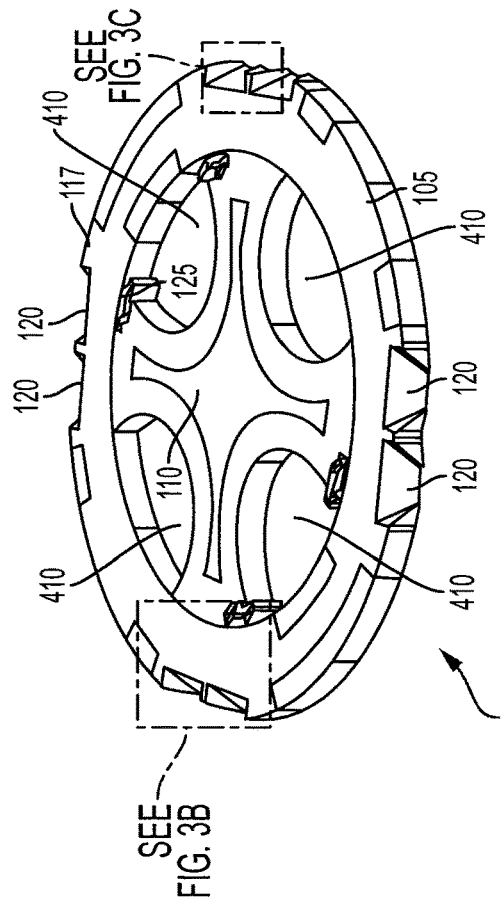
FIG. 3A

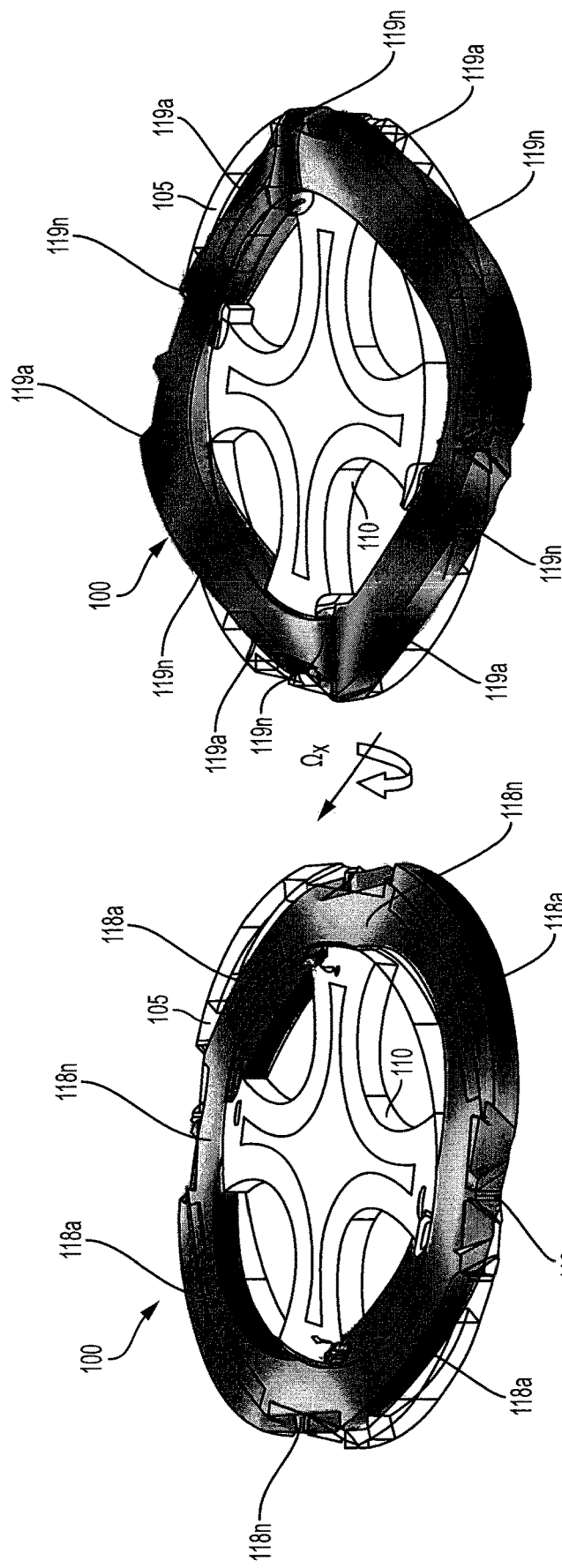

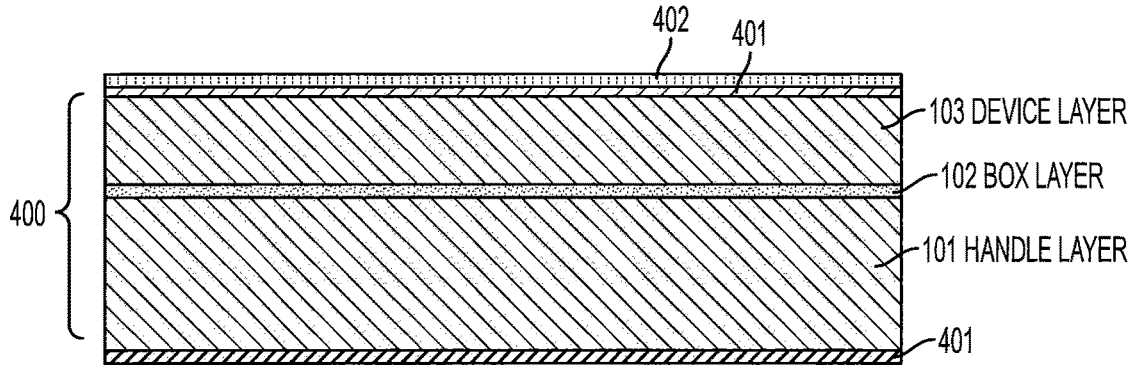
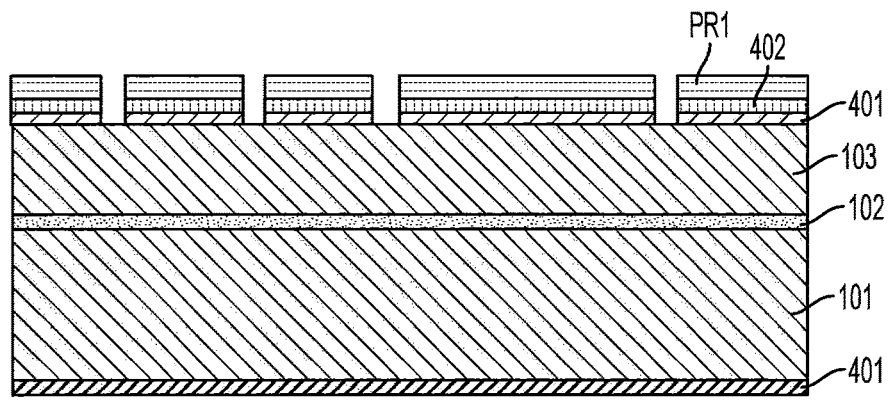
FIG. 4
FIG. 5
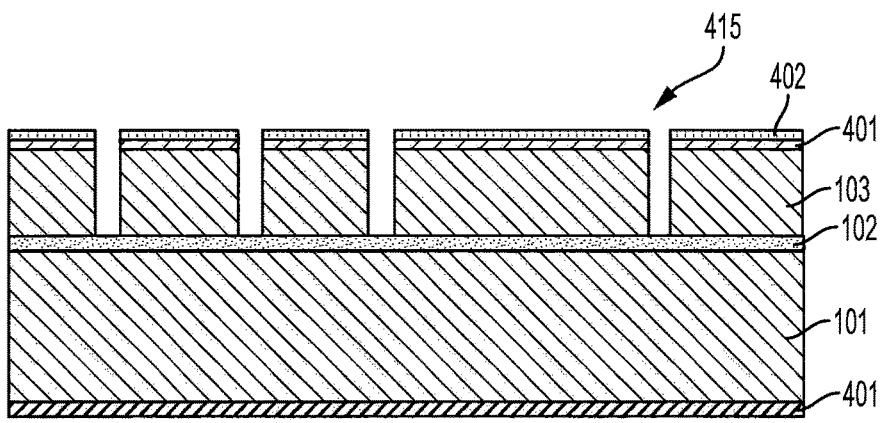
FIG. 6

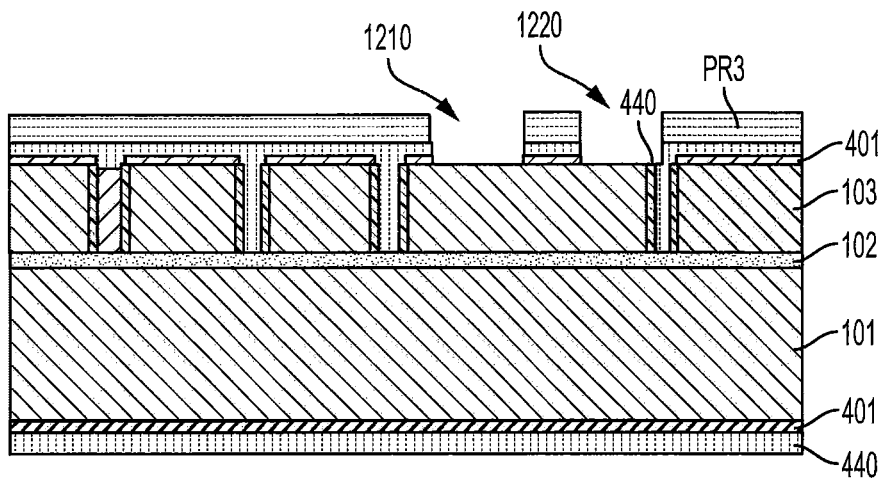
FIG. 13
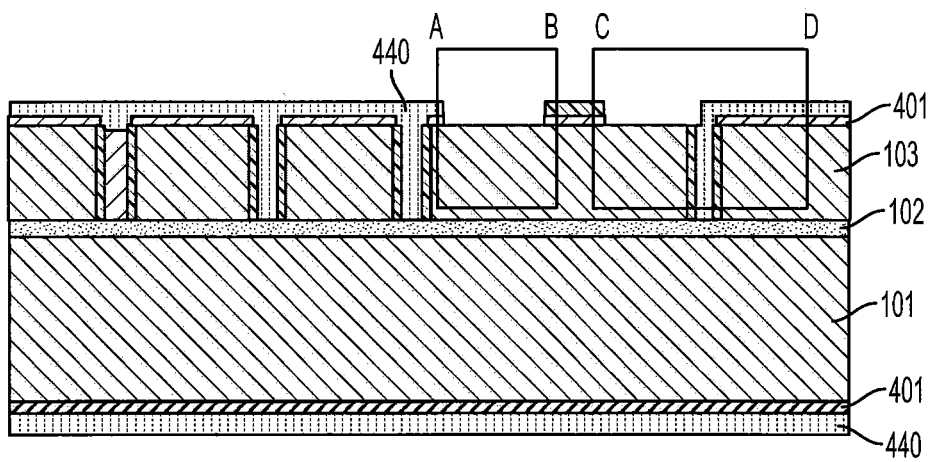
FIG. 14A
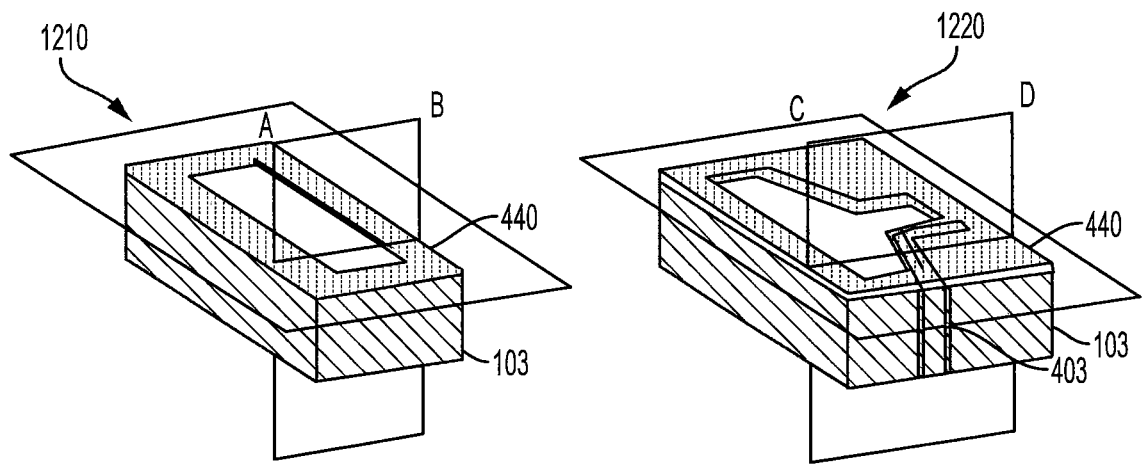
FIG. 14B
FIG. 14C

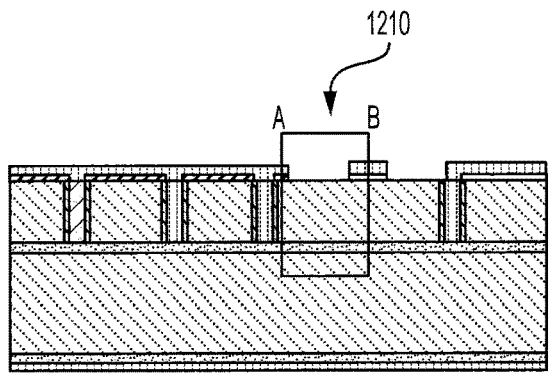
FIG. 14A1
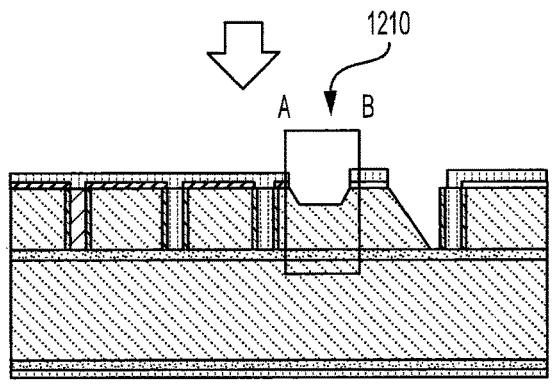
FIG. 15A1
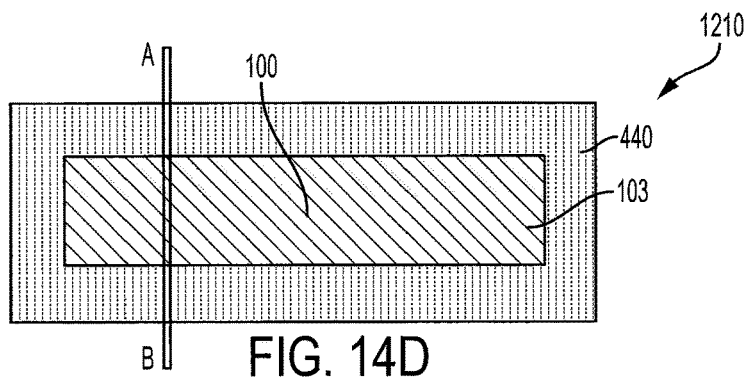
FIG. 14D
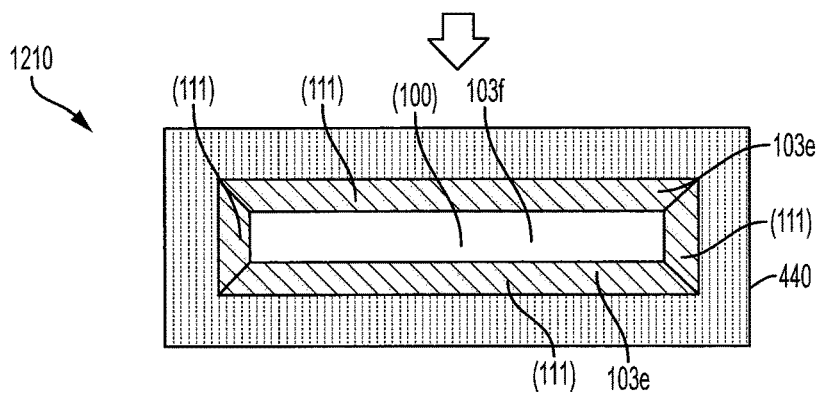
FIG. 14E

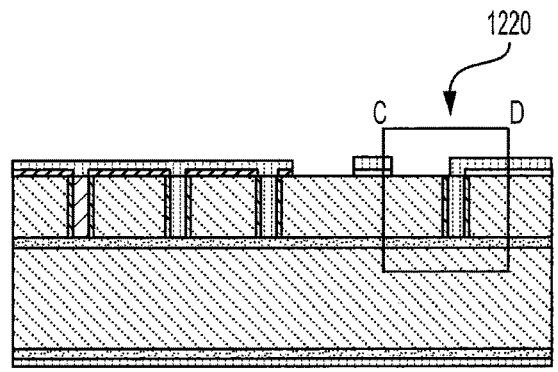
FIG. 14A2
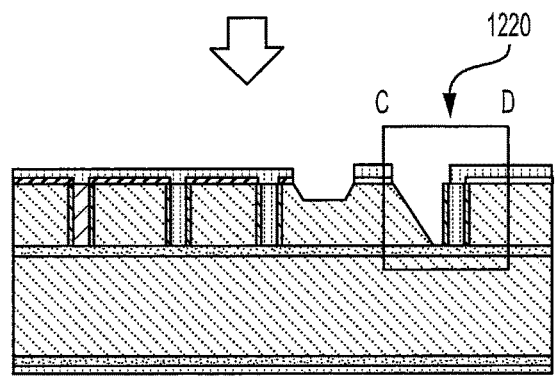
FIG. 15A2
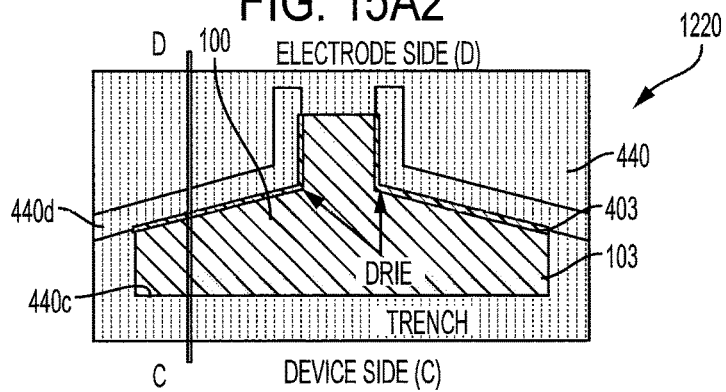
FIG. 14F
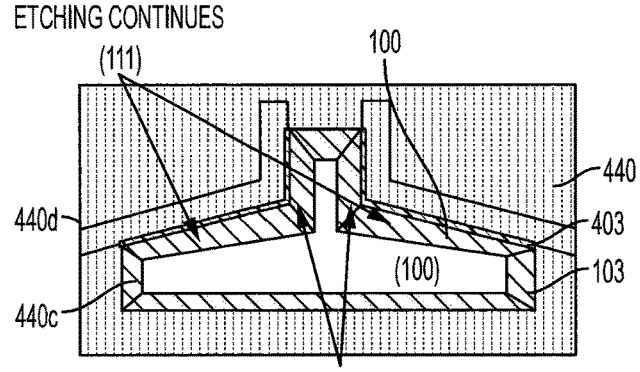
FIG. 14G

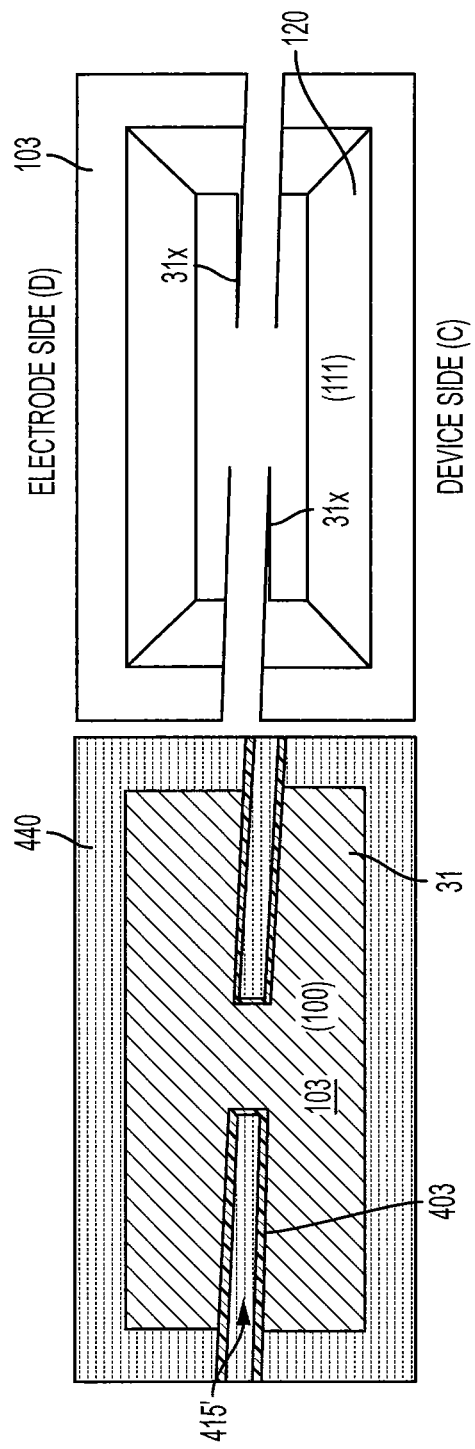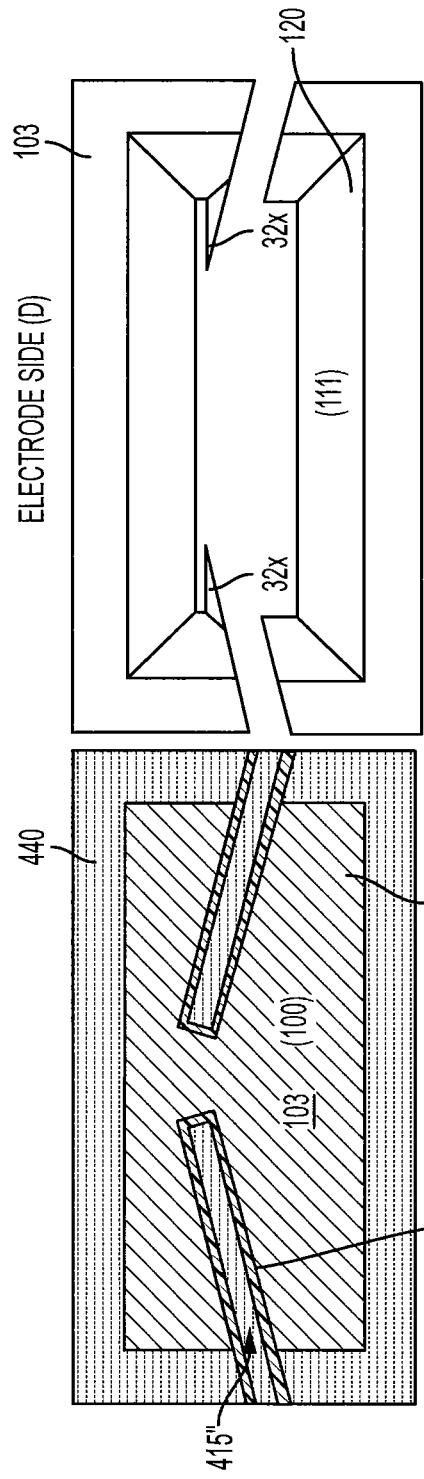

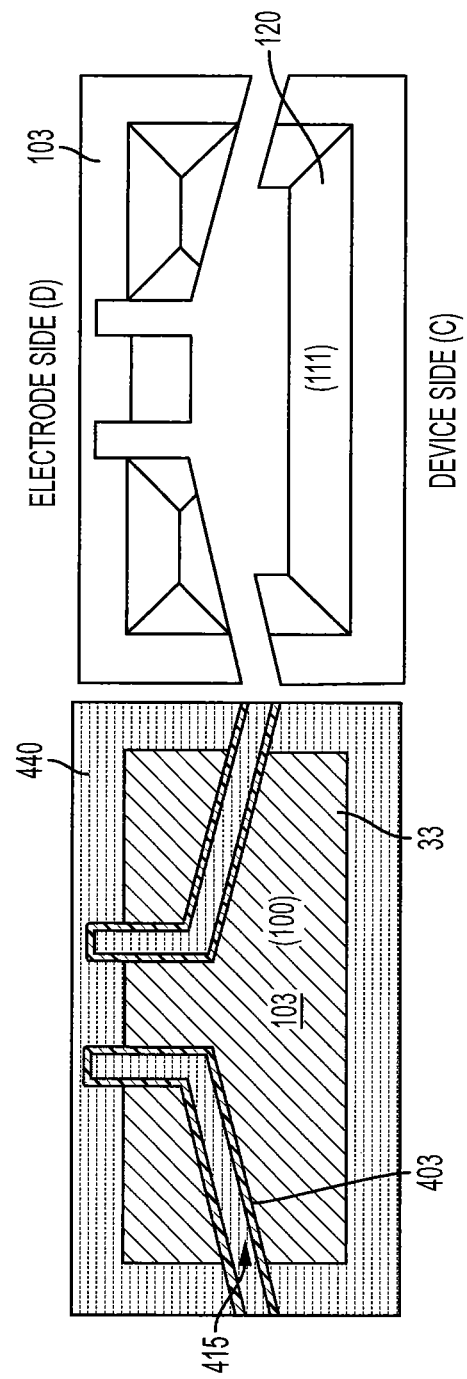

PITCH/ROLL ANNULUS GYROSCOPE WITH SLANTED QUADRATURE TUNING ELECTRODES AND RELATED FABRICATION METHODS

CLAIM OF PRIORITY

This application is a 35 U.S.C. § 371 national phase application of PCT Application No. PCT/US2017/036329 filed Jun. 7, 2017, which claims priority from U.S. Provisional Patent Application No. 62/349,700 entitled "FABRICATION METHOD FOR SLANTED ELECTRODES IN SINGLE-CRYSTAL SILICON MEMS DEVICES" and filed Jun. 14 2016, and U.S. Provisional Patent Application No. 62/346,855 entitled "AN ANISOTROPIC—WET-ETCHED PITCH OR ROLL MODE-MATCHED GYROSCOPE WITH SLANTED QUADRATURE—CANCELLATION ELECTRODES" and filed Jun. 7, 2016, in the United States Patent and Trademark Office. This application is also a continuation-in-part of and claims priority from International Patent Application No. PCT/US2016/0059408 entitled "COMB-DRIVEN SUBSTRATE DECOUPLED ANNULUS PITCH/ROLL BAW GYROSCOPE WITH SLANTED QUADRATURE TUNING ELECTRODE" and filed Oct. 28, 2016, which claims priority from U.S. Provisional Patent Application No. 62/247,267 filed Oct. 28, 2015, in the United States Patent and Trademark Office. The disclosures of these applications are incorporated by reference herein in their entireties.

STATEMENT OF GOVERNMENT INTEREST

This invention was made with government support under Grant No. N66001-11-C-4176 awarded by Space and Naval Warfare Systems Center Pacific. The government has certain rights in the invention.

FIELD

The present disclosure relates to MEMS (micro-electromechanical systems), and more particularly, to MEMS resonators and related operation and fabrication techniques.

BACKGROUND

Micro-electromechanical system (MEMS) resonators can provide small form factor, ease of integration with conventional semiconductor fabrication techniques and high f Q products. High frequency and high-Q width-extensional mode silicon bulk acoustic resonators (SiBARs) and film bulk acoustic resonators (FBARs) have demonstrated atmospheric Q factors in excess of 10,000 at or above 100 MHz, with moderate motional resistances. Bulk acoustic wave (BAW) refers to a mode of vibration that extends throughout a bulk portion of a resonator element or member. Movement of the resonator element towards a sense electrode changes the capacitive gap spacing therebetween, thereby altering the resonant frequency of the device. Such BAW resonators are described in the publication "*Low-impedance VHF and UHF Capacitive Silicon Bulk Acoustic Wave Resonators—Part I: Concept and Fabrication*" to S. Pourkamali et al., IEEE Trans. On Electron Devices, Vol. 54, No. 8, pp. 2017-2023, August 2007, the disclosure of which is incorporated herein by reference in its entirety.

Tri-axial gyroscopes are a type of MEMS resonator that may be increasingly used in handheld devices, such as smart user interfaces and gaming controllers that may require multi-dimensional motion recognition for accurate positioning. Some tri-axial gyroscopes are described in the publication "*MULTI-DOF INERTIAL MEMS: FROM GAMING TO DEAD RECKONING*" to F. Ayazi, Digest Tech. Papers Transducers'11 Conference, Beijing, China, pp. 2805-2808, 2011, the disclosure of which is incorporated herein by reference in its entirety.

While some conventional vibratory gyroscopes utilize separate proof masses for each axis' rate measurement, some gyroscopes may employ a single proof-mass for simultaneous dual-axis pitch and roll rate sensing (i.e., x- and y-axis), and may be formed, for example, using a revised version of the high-aspect-ratio polysilicon and single-crystal silicon (HARPS S)™ process. Such single-proof mass gyroscopes are described in the publication "*A MODE-MATCHED 0.9 MHZ SINGLE PROOF-MASS DUAL-AXIS GYROSCOPE*" to W. K. Sung, et al., Digest Tech. Papers Transducers'11 Conference, pp. 2821-2824, 2011, the disclosure of which is incorporated herein by reference in its entirety. The HARPSS™ process is further described in the publication "*High Aspect-Ratio Combined Poly and Single-Crystal Silicon (HARPSS) MEMS Technology*" to F. Ayazi and K. Najafi, J. Microelectromech. Syst., Vol. 9, pp. 288-294, 2000, the disclosure of which is incorporated herein by reference in its entirety. High-aspect-ratio polysilicon and single-crystal silicon (HARPSS)-on-silicon-on-insulator (SOI) silicon bulk acoustic-wave resonators are also described in the publication "*Low-Impedance VHF and UHF Capacitive Silicon Bulk Acoustic-Wave Resonators—Part II: Measurement and Characterization*" to S. Pourkamali, et al., Transactions on Electron Devices, Vol. 54, pp. 2024-2030, 2007, the disclosure of which is incorporated herein by reference in its entirety.

BAW gyroscopes are further described in U.S. Pat. No. 8,166,816 to Ayazi et al., entitled "BULK ACOUSTIC WAVE GYROSCOPE" issued May 1, 2012, the disclosure of which is incorporated herein by reference in its entirety. A self-calibration mechanism, which relies on application of a rotating electrostatic field to first and second drive electrodes simultaneously to excite both the drive and sense resonance modes of the gyroscope (and thus does not require physical rotation of the resonant body of the gyroscope) is described in U.S. Pat. No. 8,763,441 to Casinovi et al., entitled "METHOD AND APPARATUS FOR SELF-CALIBRATION OF GYROSCOPES" issued Jul. 1, 2014, and Shirazi, et al, "Combined Phase-Readout and Self-Calibration of MEMS Gyroscopes," Digest Tech. Papers Transducers 2013 Conference, Barcelona, Spain, pp. 960-963, 2013, the disclosures of which are incorporated herein by reference in their entireties.

SUMMARY

According to some embodiments, a bulk acoustic wave resonator apparatus includes a resonator member having an annulus shape, and at least one anchor structure coupling the resonator member to a substrate. A perimeter of the resonator member is at least partially defined by respective sidewalls that are slanted at an angle of about 30° to about 60° relative to a surface of the resonator member adjacent the substrate.

In some embodiments, the surface of the resonator member may be defined by a (100) crystal plane, and the angle of the respective sidewalls may be defined by a (111) crystal plane.

In some embodiments, respective tuning electrodes may be disposed adjacent the respective sidewalls of the resonator member and separated therefrom by respective capacitive gaps. Portions of the respective tuning electrodes may be slanted at respective angles that are parallel to the angle of the respective sidewalls of the resonator member to define the respective capacitive gaps therebetween.

In some embodiments, the perimeter of the resonator member may be further defined by a sidewall area that is substantially orthogonal to the surface thereof. At least one drive electrode may be disposed adjacent the sidewall area and configured to actuate movement of the resonator member responsive to application of a voltage thereto.

In some embodiments, responsive to application of respective voltages thereto, the respective tuning electrodes may be configured to produce a corresponding electrostatic force that provides a torque to the resonator member in a direction between an in-plane direction that is parallel to a surface of the substrate and an out-of-plane direction that is orthogonal to the in-plane direction.

In some embodiments, responsive to the application of the respective voltages thereto, the respective tuning electrodes may be configured such that a frequency of an in-plane drive mode of the resonator member and a frequency of an out-of-plane sense mode of the resonator member that is orthogonal to the in-plane drive mode are mode-matched.

In some embodiments, the respective tuning electrodes and the respective sidewalls may be positioned at the perimeter of the resonator member between respective nodal points of an in-plane drive mode and an out-of-plane sense mode of the resonator member.

In some embodiments, respective tether structures may couple the at least one anchor structure to the resonator member at different locations thereof. The respective tether structures may be coupled to the resonator member adjacent the respective nodal points of the out-of-plane sense mode thereof.

In some embodiments, the at least one anchor structure may be positioned within an interior of the annulus, the respective tuning electrodes may be polysilicon, and the respective sidewalls including the (111) crystal plane may define a mold for the polysilicon.

In some embodiments, the apparatus may include or be part of an inertial measurement unit (IMU). The resonator member may be a first resonator member of a first gyroscope, and a second resonator member of a second gyroscope having an annulus shape may be disposed on the substrate. At least one anchor structure may couple the second resonator member to the substrate adjacent the first resonator member. A perimeter of the second resonator member may be at least partially defined by respective sidewalls that are slanted at an angle of about 30° to about 60° relative to a surface of the second resonator member adjacent the substrate.

In some embodiments, the first and second gyroscopes may be pitch and roll gyroscopes, respectively. A yaw gyroscope may be provided on the substrate adjacent the first and/or second gyroscopes. The yaw gyroscope, the first gyroscope, and the second gyroscopes may be responsive to movement along respective orthogonal axes.

In some embodiments, at least one multi-axis accelerometer may be provided on the substrate adjacent one or more of the yaw gyroscope, the first gyroscope, and the second gyroscope.

According to further embodiments, a method of fabricating a bulk acoustic wave resonator apparatus includes forming a resonator member having an annulus shape that is coupled to a substrate by at least one anchor structure. A perimeter of the resonator member is at least partially defined by respective sidewalls that are slanted at an angle of about 30° to about 60° relative to a surface of the resonator member adjacent the substrate. The surface of the resonator member may be defined by a (100) crystal plane, and the angle of the respective sidewalls may be defined by a (111) crystal plane.

In some embodiments, the method may include forming respective tuning electrodes disposed adjacent the respective sidewalls of the resonator member and separated therefrom by respective capacitive gaps. Portions of the respective tuning electrodes may be slanted at respective angles that are parallel to the angle of the respective sidewalls of the resonator member to define the respective capacitive gaps.

In some embodiments, the perimeter of the resonator member may be further defined by a sidewall area that is substantially orthogonal to the surface thereof. At least one drive electrode may be formed adjacent the sidewall area and may be configured to actuate movement of the resonator member responsive to application of a voltage thereto.

In some embodiments, the resonator member may be single crystal silicon, the surface of the resonator member may include a (100) silicon crystal plane, and the respective sidewalls may include a (111) silicon crystal plane.

In some embodiments, the sidewall area may be formed by a reactive ion etching process, and the respective sidewalls may be formed by an anisotropic wet etching process.

In some embodiments, the anisotropic wet etching process may include forming a thermal oxide as an etching mask that exposes respective surfaces of the single crystal silicon comprising the (100) silicon crystal plane opposite the substrate, and wet etching the surfaces of the single crystal silicon exposed by the thermal oxide to form the respective sidewalls comprising the (111) silicon crystal plane.

In some embodiments, the wet etching may use potassium hydroxide (KOH) as an etchant.

In some embodiments, the wet etching may expose a buried oxide layer beneath the surface of the resonator member comprising the (100) crystal plane.

In some embodiments, the reactive ion etching process may form trenches in the single crystal silicon defining the sidewall area of the resonator member. The anisotropic wet etching process may include forming the thermal oxide in one or more of the trenches and to define the etching mask for the wet etching, responsive to the reactive ion etching process. The respective surfaces of the single crystal silicon exposed by the thermal oxide may be between the one or more of the trenches.

In some embodiments, forming the at least one drive electrode may include forming a first polysilicon layer in the trenches in the single crystal silicon responsive to the reactive ion etching process, and selectively removing the first polysilicon layer from the one or more of the trenches prior to forming the thermal oxide in the one or more of the trenches.

In some embodiments, forming at least one drive electrode and forming the respective tuning electrodes may include forming a second polysilicon layer on a portion of the first polysilicon layer remaining in at least one of the trenches and along the respective sidewalls comprising the (111) silicon crystal plane responsive to the anisotropic wet etching process, and patterning the second polysilicon layer to define the at least one drive electrode and the respective tuning electrodes.

According to still further embodiments, a bulk acoustic wave pitch/roll gyroscope includes an annulus-shaped resonator member, a perimeter of the annulus-shaped resonator member being defined by a sidewall area that is substantially orthogonal to a surface of the annulus-shaped resonator member and being at least partially defined by respective sidewalls that are slanted at an angle relative to the surface. At least one anchor structure is disposed within the perimeter of the annulus-shaped resonator member and couples the annulus-shaped resonator member to a substrate. At least one drive electrode is disposed adjacent the sidewall area and is configured to actuate movement of the annulus-shaped resonator member responsive to application of a voltage thereto. Respective tuning electrodes, which are slanted at respective angles parallel to the angle of the respective sidewalls of the annulus-shaped resonator member and separated therefrom by respective capacitive gaps, are configured to provide quadrature error tuning between different resonance modes of the annulus-shaped resonator member responsive to application of respective voltages thereto.

In some embodiments, the annulus-shaped resonator member may be single crystal silicon, the surface of the annulus-shaped resonator member may include a (100) silicon crystal plane, and the angle may be defined by a (111) silicon crystal plane.

According to some embodiments, a microelectromechanical resonator includes an annulus-shaped single-crystal semiconductor resonator member attached to a substrate by at least one anchor. The resonator member has a slanted sidewall that extends along a (111) crystal plane thereof and intersects with a surface of the resonator member that extends along a (100) crystal plane. A slanted tuning electrode is capacitively coupled to the slanted sidewall.

Other apparatus and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIG. 1 is a plan view illustrating electrode configuration in a pitch/roll annulus gyroscope including slanted electrodes in accordance with some embodiments of the present disclosure.

FIG. 2 is a plan view scanning electron microscope (SEM) image of the pitch/roll annulus gyroscope including slanted electrodes in accordance with some embodiments of the present disclosure.

FIG. 3A is a perspective view illustrating an annulus resonator member including slanted sidewalls of a pitch/roll annulus gyroscope in accordance with some embodiments of the present disclosure.

FIG. 3B is an enlarged perspective view illustrating the slanted sidewall portions of the annulus resonator member of FIG. 3A.

FIG. 3C is a partial cross-section illustrating the slanted sidewall mating surfaces of the annulus resonator member of FIG. 3A and a slanted quadrature tuning electrode in accordance with some embodiments of the present disclosure.

FIG. 3D is an enlarged perspective view illustrating the slanted quadrature tuning electrodes of the pitch/roll annulus gyroscope of FIG. 3A.

FIGS. 3E and 3F are perspective views illustrating displacement of an annulus resonator member in a drive mode and a sense mode, respectively, during operation of an annulus pitch/roll BAW gyroscope including slanted electrodes in accordance with some embodiments of the present disclosure.

FIGS. 4-25 are cross-sectional schematic views illustrating methods of fabricating slanted electrodes in a pitch/roll annulus gyroscope in accordance with some embodiments of the present disclosure. FIGS. 4, 5, 6, 7, 8, 9, 10, and 11 illustrate operations for vertical electrode formation and silicon protection; FIGS. 12, 13, and 14A, 14A1, 14A2, 14B, 14C, 14D, 14E, 14F, 14G, 14H, 14I, and 14J illustrate anisotropic etching operations to define slanted sidewalls; and FIGS. 15, 15A1, 15A2, 16, 17, 18, 19, 20, 21, 22, 23, 24, and 25 illustrate operations for top and slanted electrode formation.

FIGS. 31A-31B, 32A-32B, and 33A-33B illustrate different trench designs for anisotropic etching operations to form slanted electrodes of different shapes in accordance with some embodiments of the present disclosure.

DETAILED DESCRIPTION

Figure 7:
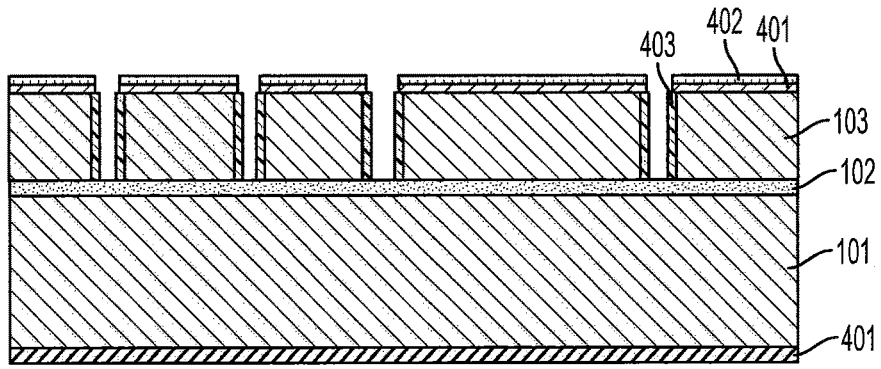

Example embodiments of the present disclosure are directed to bulk acoustic wave (BAW) resonators, with particular embodiments directed to a BAW annulus pitch or roll gyroscope design with HARPSS+ fabricated nano-gap slanted sidewall electrodes. Such embodiments can improve performance of BAW gyroscopes with respect to quadrature error. While described primarily herein by way of example with reference to annulus pitch/roll BAW gyroscopes, it will be understood that the inventive concepts of the present disclosure are not so limited. More generally, embodiments of the present disclosure are applicable to any BAW resonator or inertial measurement apparatus that include drive electrodes, sense electrodes, tuning electrodes, and/or tether structures.

High-frequency resonant (i.e. mode-matched) gyroscopes may provide high performance and superior robustness against vibration and environmental conditions. Integration of tri-axial high-frequency gyroscopes may be used to realize high-performance single-chip inertial measurement units (IMUs). The HARPSS™ process has been used to fabricate both yaw and pitch/roll BAW gyroscopes. However, the yield and performance of pitch or roll gyroscopes may be limited by quadrature errors originated from substrate and fabrication imperfections, which can cause frequency veering effects that may present challenges to perfect mode-matching. Quadrature may also cause inaccurate sense output and noise injection, which can be detrimental for gyroscopes. Electrostatic quadrature tuning for pitch or roll gyroscopes can be achieved using electrodes that parallel to slanted sidewalls with capacitive gaps affected by both in-plane (IP) motion (motion that is parallel to a plane defined by a surface of a substrate to which the gyroscope is coupled) and out-of-plane (OOP) motion (motion that is non-parallel to the plane defined by the surface of the substrate). Slanted surfaces can be generated through anisotropic wet-etching of the single crystal silicon (SCS). However, anisotropic wet-etching alone may only generate structures along straight crystal lines, which can limit design freedom. In addition, a wet-etching-only process may not be compatible with some traditional MEMS inertial sensors.

Embodiments of the present disclosure are directed to high-frequency pitch or roll annulus gyroscopes with slanted electrodes. In some embodiments, the slanted electrodes are fabricated through a HARPSS+ fabrication process as described herein, which combines silicon anisotropic wet-etching with a deep reactive-ion etching (DRIE) process and allows the integration of multi-axis sensors on a single chip, which may be feasible for integrated IMU fabrication. In particular, the slanted electrodes are configured to provide effective quadrature tuning and/or cancellation in a high-frequency pitch or roll bulk acoustic wave (BAW) gyroscope, to allow mode-matching for sensitivity improvement and noise reduction. Some gyroscopes according to embodiments of the present disclosure may have a high operating frequency (for example, about 0.5 MHz or more) and high translational stiffness for shock and vibration robustness.

Quadrature tuning and/or cancellation in high-performance pitch or roll gyroscopes as described herein is achieved by incorporating nano-gap slanted electrodes, which in some embodiments are fabricated using a HARPSS+ fabrication process. The HARPSS+ fabrication process combines anisotropic wet-etching of silicon with a deep reactive-ion etching (DRIE)-based HARPSS process. The HARPSS+ fabrication process can allow precision capacitive transduction and tuning in all desired orientations, providing tuning coverage over typical process corners and improving the yield of pitch/roll gyroscopes. In some embodiments, quadrature tuning and/or cancellation in devices fabricated in accordance with some embodiments of the present disclosure can allow perfectly mode-matched operation with a scale factor of 95.2 pA/(°/s) and an open-loop bandwidth of 15 Hz. The HARPSS+ fabrication process can also allow simultaneous fabrication of single-chip tri-axial BAW gyroscopes, and in some embodiments, high-frequency (0.5-5 MHz) gyroscopic modes with high quality factors (10,000s-100,000s) can be measured on both yaw and pitch/roll BAW gyroscopes on the same wafer.

FIG. 1 is a plan view illustrating electrode configuration in a bulk acoustic wave (BAW) resonator apparatus 100, shown as a pitch or roll annulus gyroscope, including slanted electrodes in accordance with some embodiments of the present disclosure. FIG. 2 is a scanning electron microscope (SEM) image of the pitch or roll annulus gyroscope 100 of FIG. 1.

As shown in FIGS. 1 and 2, the BAW resonator apparatus 100 includes a resonator member 105, shown as an annulus, and an anchor structure 110 suspending the resonator member 105 over a substrate. The anchor structure 110 is shown as a unitary member that is coupled to the resonator member 105 at four locations within an interior of the annulus by way of example, but it will be understood that embodiments of the present disclosure may include multiple anchor structures and/or fewer or additional couplings to the interior and/or exterior of the resonator member. In the example of FIGS. 1 and 2, the anchor structure 110 is coupled to the resonator member 105 by respective tether structures 125. While illustrated as having the same shape, the tether structures 125 may have different shapes at different locations of the interior of the resonator member 105. The BAW gyroscope 100 may have a resonance frequency of greater than 200 kHz, and in some embodiments, about 500 kHz or more. Additional features of annulus gyroscopes are described in U.S. Patent Application Publication No. 2013/0283911 entitled "MODE-MATCHED SINGLE PROOF-MASS DUAL-AXIS GYROSCOPE AND METHOD OF FABRICATION" to Ayazi, et al., the disclosure of which is incorporated by reference herein in its entirety.

Still referring to FIGS. 1 and 2, the BAW resonator apparatus 100 further includes slanted quadrature tuning electrodes 420 disposed at a perimeter or edge 117 of the resonator member 105. The perimeter 117 of the resonator member 105 is at least partially defined by respective sidewalls 120 that are slanted at an angle relative to a plane defined by a surface of the resonator member 105 (as shown in greater detail in FIGS. 3A-3C), where the angle corresponds to or is otherwise adapted to mate with the slanted quadrature tuning electrodes 420.

As shown in FIG. 1, pairs of the tuning electrodes 420 (which are configured to be applied with voltages $V_{DC3}$, $V_{DC4}$) are separated from one another by approximately 90 degrees around the circumference of the annulus resonator member 105. In some embodiments, the tuning electrodes 420 are positioned between the nodal points 118n of an in-plane (IP) mode and nodal points 119n of an out-of-plane (OOP) mode (see FIGS. 3E-3F). As described herein, movement of the resonator member 105 in the in-plane mode is parallel to a plane defined by a surface of a substrate 101 (see FIG. 25), while movement of the resonator member 105 in the out-of-plane mode is non-parallel to the plane defined by the surface of the substrate 101. Nodal points refer to locations of the resonator member 105 that experience close to zero displacement in a specific mode, while anti-nodal points refer to locations of the resonator member 105 that experience maximum displacement in a mode. In response to application of the voltages $V_{DC3}$, $V_{DC4}$ the slanted quadrature tuning electrodes 420 are configured to produce a corresponding electrostatic force that provides a torque to move the resonator member 105 in a direction between the IP direction and an OOP direction that is orthogonal to the in-plane direction. Additional tuning electrodes, which are configured to be applied with in-plane frequency tuning voltages $V_{DC1}$ and out-of-plane frequency tuning voltages $V_{DC2}$, are provided in the hollow internal sections 410 defined between the anchor structure 110 and the annulus resonator member 105.

In addition, as shown in FIG. 1, one of the in-plane mode anti-nodal points 118a may be applied with a drive voltage to actuate the resonator member 105, and another of the in-plane mode anti-nodal points 118a and one or more of the out-of-plane anti-nodal points 119a may be used for detection of displacement of the resonator member 105. The tether structures 125 are located at or adjacent the nodal points 119n for the out-of-plane sense mode. In some embodiments, the shape(s) of the tether structures 125 may be locally engineered or configured to allow only in-plane movement that coincides with the local deformation of the in-plane drive mode. Consequently, the annulus resonator member 105 can be substrate-decoupled for the drive mode, but rigid for translational motions, and can reject undesired deformations.

FIG. 3A is a perspective view illustrating the bulk acoustic wave (BAW) resonator apparatus 100 of FIG. 1, again shown as an pitch/roll annulus gyroscope, in accordance with some embodiments of the present disclosure. As shown in FIG. 3A, the annulus resonator member 105 is coupled to a substrate by at least one anchor structure 110. The resonator member 105 is configured for placement of respective electrodes at various positions within the interior of the annulus and around the perimeter 117 of the annulus to provide drive, sense, and tuning functions. FIG. 3B is an enlarged perspective view illustrating slanted sidewall portions 120 of the annulus resonator member 105. As shown in FIG. 3B, the perimeter 117 of the resonator member 105 is at least partially defined by respective sidewalls 120 that are slanted at an angle relative to a plane defined by a surface of the resonator member 105.

In some gyroscopes, imperfections such as non-vertical trench sidewalls due to DRIE-based fabrication can cause cross-coupling between in-plane and out-of-plane modes (quadrature), which can prevent mode-matching and can degrade noise performance. For example, quadrature error in pitch or roll gyroscopes may result from stiffness-coupling between IP and OOP motions represented by off-diagonal terms in the mechanical stiffness matrix. One reason for the coupling may be tiling of the DRIE-formed trenches, due to non-uniform etching angle across the wafer. An IP incident acoustic wave bouncing off a non-vertical sidewall of such trenches will generate an OOP reflective component, causing energy coupling from the IP mode to the OOP mode, or vice versa. To electrostatically compensate for such undesired coupling, capacitive transduction mechanisms with coupled dependence on IP and OOP motions may be used, which can be accomplished with slanted quadrature tuning electrodes as described herein.

In particular, some embodiments of the present disclosure may implement slanted sidewalls 120 and correspondingly slanted tuning electrodes 420 for quadrature error tuning and/or cancellation. The slanted sidewalls 120 are located at the perimeter 117 (here, a circumference) of the annulus resonator member 105. In some embodiments, the slanted sidewalls 120 are fabricated by an anisotropic silicon wet etching process that is performed after the DRIE operations used to define the non-vertical sidewalls (also referred to herein as substantially orthogonal sidewalls) of the annulus resonator member 105. The gap size of the capacitive gap 420g between the slanted sidewalls 120 of the annulus 105 and the slanted sidewalls of the electrode 420 is selected or otherwise configured based on both in-plane and out-of-plane motion, which can allow for quadrature tuning.

FIG. 3C is a partial cross-section illustrating the slanted sidewall mating surfaces of the annulus resonator member 105 and a tuning electrode 420 in an pitch/roll annulus gyroscope 100 in accordance with some embodiments of the present disclosure. FIG. 3D is an enlarged perspective view illustrating the slanted tuning electrodes 420. The tuning electrodes 420 are configured to be applied with quadrature error cancellation voltages $V_{DC3}$, $V_{DC4}$, and are positioned at sidewalls 120 of the perimeter 117. The sidewalls 120 are slanted at an angle $\theta$ relative to a plane defined by a surface of the resonator member 105. The tuning electrodes 420 may be polysilicon in some embodiments.

The tuning electrodes 420 have sidewalls that are slanted at a corresponding angle with respect to (and thus, are adapted to mate with) the sidewalls 120 of the resonator member 105. As shown in FIG. 3C, a sidewall portion of the tuning electrode 420 is slanted at a supplementary angle as the sidewall 120 of the resonator member 105, such that the slanted tuning electrode 420 and the slanted sidewall 120 of the annulus resonator member 105 are separated by a uniform capacitive gap 420g. Voltages $V_{DC3}$, $V_{DC4}$ may be applied to the tuning electrodes 420 to provide quadrature error reduction and/or cancellation.

Still referring to FIG. 3C, the angle $\theta$ of the slanted sidewall 120 may be about 30° to about 60°, for example, 45°. The angle $\theta$ of the slanted sidewall 120 is defined by the (111) crystal plane (relative to the (100) crystal plane of the opposing surfaces of the resonator member 105) to be about 54.7° in some embodiments. The slanted sidewall 120 may thereby define an acute angle with a lower surface of the resonator member 105 (e.g., adjacent the underlying surface or substrate 101), and may define an obtuse angle with an upper surface of the resonator member 105. This angle may be achieved, for example, by using a wet etching process that is selective to the (111) crystal plane.

For an applied quadrature tuning voltage $V_{DC3}$, $V_{DC4}$, the tuning electrodes 420 are configured to produce a corresponding electrostatic force, which produces a torque in-between the in-plane and out-of-plane direction. This aligns each mode to the proper displacement plane, thus reducing or eliminating quadrature in some embodiments. Responsive to application of predetermined tuning voltages $V_{DC1}$, $V_{DC2}$ and quadrature cancellation voltages $V_{DC3}$, $V_{DC4}$, the frequency of the in-plane drive mode, the first orthogonal out-of-plane sense mode, and/or the second orthogonal out-of-plane sense mode can be mode-matched, and the cross-coupling noise between in-plane and out-of-plane modes can be reduced or minimized Additional features of slanted quadrature error cancellation electrodes are described in International Patent Application No. PCT/2016/37186 entitled "MEMS INERTIAL MEASUREMENT APPARATUS HAVING SLANTED ELECTRODES FOR QUADRATURE TUNING," to Ayazi et al., filed Jun. 13, 2016, the disclosure of which is incorporated by reference herein in its entirety.

FIGS. 3E and 3F are perspective views illustrating displacement (or mode shape) of an annulus resonator member 105 in an in-plane (IP) drive mode and an out-of-plane (OOP) sense mode, respectively, during operation of an annulus pitch/roll BAW gyroscope apparatus 100 including slanted electrodes in accordance with some embodiments of the present disclosure. As shown in FIGS. 3E and 3F, the apparatus 100 uses m=2 in-plane mode as the drive mode (FIG. 3E) and m=3 out-of-plane mode as the sense mode (FIG. 3F).

In contrast with some conventional vertical or horizontal electrodes, a properly placed slanted quadrature tuning electrode 420 in accordance with embodiments of the present disclosure defines a uniform capacitive gap 420g between the surface of the electrode 420 and the slanted sidewall surface 120 of the resonator member 105. The capacitive gap 420g varies under both IP and OOP motions of the resonator member 105, providing an electrostatic stiffness matrix with non-zero off-diagonal terms to compensate the off-diagonal mechanical stiffness. The electrostatic stiffness matrix of a slanted electrode is given by:

$$K_e = \begin{bmatrix} k_{e11} & k_{e12} \\ k_{e21} & k_{e22} \end{bmatrix} = \frac{-V_Q^2}{2} \begin{bmatrix} \dfrac{\partial^2 C(q_1, q_2)}{\partial q_1^2} & \dfrac{\partial^2 C(q_1, q_2)}{\partial q_1 \partial q_2} \\ \dfrac{\partial^2 C(q_1, q_2)}{\partial q_1 \partial q_2} & \dfrac{\partial^2 C(q_1, q_2)}{\partial q_2^2} \end{bmatrix}, \quad (1)$$

$$= \frac{-\varepsilon_0 A V_Q^2}{g_0^3} \begin{bmatrix} \alpha_1^2 \sin^2\theta & \pm \alpha_1 \alpha_2 \sin\theta \cos\theta \\ \pm \alpha_1 \alpha_2 \sin\theta \cos\theta & \alpha_2^2 \cos^2\theta \end{bmatrix}$$

where A, $g_0$, $\theta$, $V_Q$, $q_1$, and $q_2$ are transduction area, initial gap size, slanting angle from horizontal plane, quadrature tuning voltage, and resonant displacements at anti-nodes of the IP and OOP modes, respectively. Coefficients $\alpha_1$ and $\alpha_2$ represent the relative displacement amplitude at the electrode 420. The value of a depends on the location of the electrode 420, which ranges from 0 at nodes to 1 at anti-nodes. A high-frequency annulus gyroscope 100 in accordance with embodiments of the present disclosure is thus designed with slanted electrodes 420 incorporated for quadrature tuning. Some embodiments have an operating frequency of 0.53 MHz with m=2 IP wine-glass mode as drive mode (FIG. 3E) and m=3 OOP bending mode as sense mode (FIG. 3F). The slanted quadrature tuning electrodes 420 may be positioned on the perimeter 117 of the resonator member 105 at a location where the drive and sense mode anti-nodes coincide. However, placing slanted electrodes at such locations may sacrifice the tuning area for frequency mismatch compensation. For gyroscopes using non-degenerate modes, frequency mismatch may require larger electrostatic compensation than quadrature. Therefore, in some embodiments the slanted electrodes 420 with $\theta$=54.7° (FIG. 3C) are placed near the nodes of the IP mode, for example, between the nodal points of the IP mode and the nodal points of the OOP mode. The displacement coefficients are simulated to be $\alpha_1$=0.24 and $\alpha_2$=0.71. Equation (1) gives:

$$K_e = \begin{bmatrix} k_{e11} & k_{e12} \\ k_{e21} & k_{e22} \end{bmatrix} = \frac{-\varepsilon_0 A V_Q^2}{g_0^3} \begin{bmatrix} 0.04 & \pm 0.08 \\ \pm 0.08 & 0.16 \end{bmatrix} \quad (2)$$

As shown above, the quadrature electrode 420 has non-identical diagonal terms. Therefore, quadrature tuning may be accompanied with proper frequency tuning to achieve mode-matching in accordance with embodiments described herein. For example, for process imperfections of ±0.4 μm trench size variation and ±0.35 μm SOI thickness variation, the as-fabricated frequency-split may have a maximum of about 14 kHz. In some embodiments, the gap-size is chosen to be about 300 nm to provide sufficient tuning coverage for the frequency-split as well as quadrature errors due to ±0.3° DRIE trench tilting with voltages less than 20V. As described herein, the term "substantially orthogonal" may refer to sidewalls of the resonator member 105 that are imperfectly vertical relative to a plane defined by a top or bottom surface of the resonator member 105, for example, due to DRIE-formed trench tilting. Flexible tethers 125 located adjacent the nodes 119n of the OOP mode are used to connect the annulus resonator member 105 to a center anchor 110 with negligible anchor loss, making the quality factor to be thermoelastic damping (TED)-limited for both modes. The design of the tethers 125 also provides good translational motion rejection. The lowest resonance modes of the structure have frequencies above 150 kHz, which can provide robustness against shock and vibration.

FIGS. 4-25 are cross-sectional schematic views illustrating methods of fabricating slanted sidewalls and slanted electrodes in a pitch/roll annulus gyroscope 100 in accordance with some embodiments of the present disclosure. As noted above, slanted electrodes may be beneficial in capacitive MEMS devices. For example, in out-of-plane pitch or roll gyroscopes, slanted electrodes provide a correlation between in-plane and out-of-plane modes, which allows for quadrature tuning; and in out-of-plane accelerometers, combining slanted electrodes and out-of-plane electrodes can allow for shock stop formation.

While some conventional BAW resonators can be fabricated with HARPS S processes to provide vertical and horizontal electrodes with sub-micron capacitive gaps, embodiments of the present disclosure are directed to fabrication of slanted electrodes along with vertical and horizontal electrodes. In some embodiments, the fabrication process is a directional dry-etching and anisotropic wet-etching combined single-crystal silicon and polysilicon process. The process may include vertical electrode formation and silicon protection operations (as shown in FIGS. 4-11), silicon anisotropic wet-etching operations (as shown in FIGS. 12, 13, and 14A-14J), and top and slanted electrodes formation operations (as shown in FIGS. 15-25). In some embodiments, the fabrication process can be used to form vertical, horizontal, and slanted electrodes in a single device. In other embodiments, the process can be used to form the slanted electrodes without the vertical and/or horizontal electrodes, by omitting one or more operations.

FIGS. 4-11 illustrate operations for vertical electrode formation and silicon protection in forming a pitch/roll annulus gyroscope 100 in accordance with some embodiments of the present disclosure. In the examples of FIGS. 4-11, a vertical electrode 115 is defined by etching vertical trenches 415 by directional etching on device layer 103 of a (100) silicon-on-insulator (SOI) wafer 400. The wafer 400 may be monocrystalline or single-crystal silicon (SCS) in some embodiments. These trenches 415 may define the major geometry of the MEMS device. For example, the trenches 415 may define a majority of the sidewall area of the resonator member 105. Thermal oxidation of silicon is used to form sacrificial layer 403 that defines vertical gap-size. After the thermal oxidation, a polysilicon layer 404 is deposited to fill the trenches. The polysilicon layer 404 is patterned to define vertical electrodes 115 and removed from trenches where vertical electrodes 115 are not desired. TEOS (tetraethyl orthosilicate) 440 is deposited to refill the trenches 415 and cover the wafer surface. The combined thermal oxide 403 and TEOS 440 provides good coverage of the sidewalls of the trenches 415 and vertical polysilicon electrodes 115, keeping them unattacked in following wet-etching steps. In addition, the TEOS 440 covers both the top and bottom surfaces of the wafer, serving as hard mask layers for the steps following.

In particular, as shown in FIG. 4, a wet oxide layer 401 is grown on opposing surfaces of a silicon device layer 103 and an underlying substrate or handle layer 101 including a buried oxide layer 102 therebetween. In some embodiments, the wet oxide layer 401 may be grown to a thickness of about 2 to 2.5 micrometers (μm) at a temperature of about 1100° C. A plasma enhanced chemical vapor deposition (PECVD) process is performed to form a PECVD oxide layer 402 on the grown oxide 401. As shown in FIG. 5, a photoresist pattern PR1 is formed on the PECVD oxide layer 402, and the oxide layers 402 and 401 are etched using the photoresist pattern PR1 as a mask to expose portions of the device layer 103. In some embodiments, the etching of the oxide layers 402 and 401 may be performed using a reactive ion etching (RIE) process for about 120 minutes, with an etch rate of about 45-48 minutes/1 μm of oxide.

As shown in FIG. 6, the portions of the silicon device layer 103 exposed by etched oxide layers 402, 401 are etched to define trenches 415 that expose the buried oxide layer 102. In some embodiments, a deep reactive-ion etching (DRIE) process is used to etch the trenches 415 into the silicon device layer 103 of the (100) SOI wafer 400. As shown in FIG. 7, the wafer 400 is oxidized to form a sacrificial oxide (SACOX) layer 403 on the sidewalls of the trenches 415, which define the gap-size for vertical electrodes 115 that are subsequently formed in the trenches 415. In some embodiments, a dry oxide may be grown to a thickness of about 350 nanometers (nm) to define the SACOX layer 403 on the sidewalls of the trenches 415.

Figure 8:
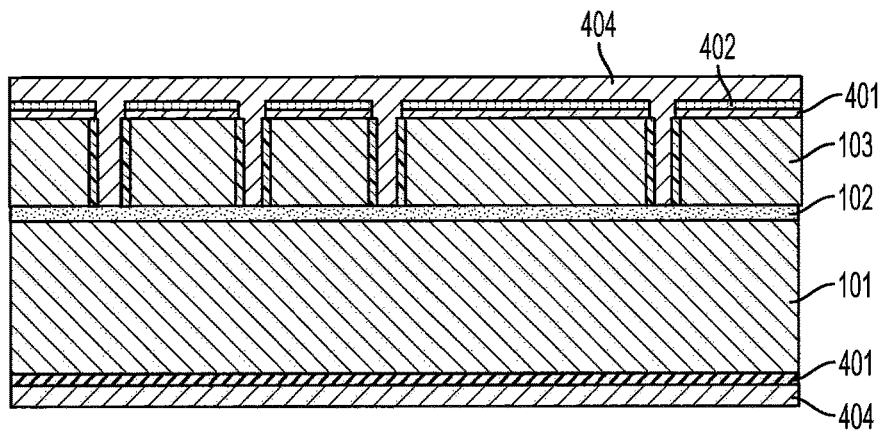
Figure 9:
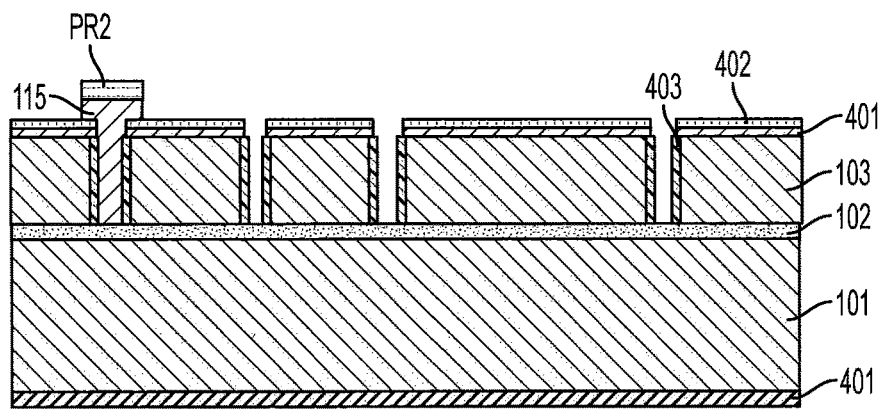
Figure 10:
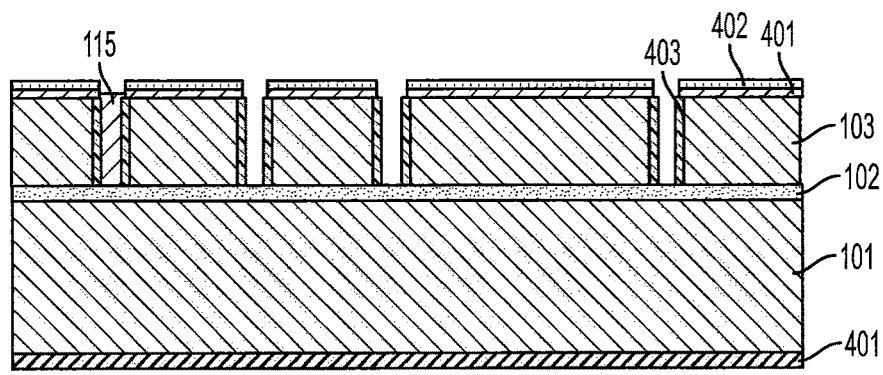
Figure 11:
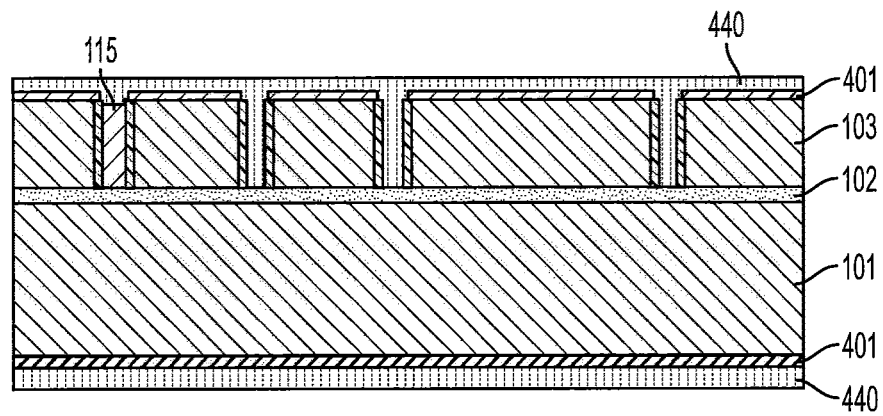

As shown in FIG. 8, a first polysilicon layer 404 is deposited to fill the trenches 415. For example, the first polysilicon layer 404 may be deposited, etched-back, and redeposited until the trenches 415 are filled. As shown in FIG. 9, the first polysilicon layer 404 is selectively etched to form one or more vertical electrodes 115. The first polysilicon layer 404 is removed from one or more of the trenches 415 where vertical electrodes 115 are not desired. For example, a blanket etching process may be used to remove the polysilicon 404 from the trenches 415 to expose the oxide layers 403 on the sidewalls thereof, using a photoresist layer PR2 as an etching mask. The photoresist pattern PR2 and portions of the vertical electrode 115 outside of the trench 415 are removed as shown in FIG. 10, and a tetraethyl orthosilicate (TEOS) layer 440 is deposited to refill the trenches 415 and protect the top surface of the wafer 400 as shown in FIG. 11. The TEOS layer 440 may be performed by a low pressure chemical vapor deposition (LPCVD) process. The TEOS layer 440 is then patterned to open the regions for SCS wet-etching to form the slanted sidewall surfaces 120, as described below.

In order to create slanted electrodes in BAW resonators, some embodiments of the present disclosure may utilize a HARPSS+ process, which includes an anisotropic wet-etching operation in combination with the HARPSS™ process. FIGS. 12, 13, and 14A-14J illustrate anisotropic wet etching operations in forming slanted sidewalls 120 for a pitch/roll annulus gyroscope 100 in accordance with some embodiments of the present disclosure. The wet-etching operations define the final geometry of the single-crystal silicon device 100, expose slanted (111) sidewalls 120, and form molds for fabrication of the slanted polysilicon electrodes 420.

Figure 12:
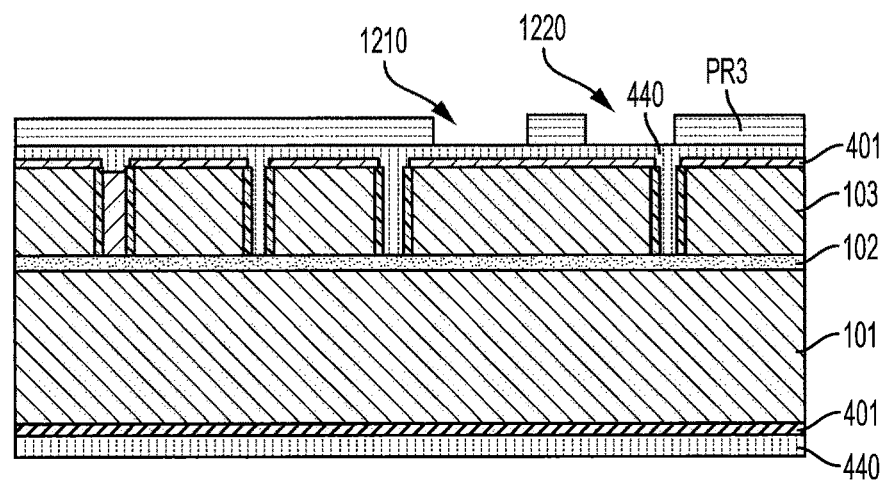

As shown in FIG. 12, a photoresist pattern PR3 is formed on the TEOS layer 440. For example, the photoresist pattern PR3 may be spin-coated onto the TEOS layer 440 to expose wet-etching areas. Locations at the device edge 1220 and/or above the bulk structure 1210 may be exposed by the photoresist mask PR3 for forming slanted electrodes 420 and top electrodes 430 as described herein.

As shown in FIG. 13, the TEOS layer 440 and the underlying oxide layers 402, 401 are etched using the photoresist pattern PR3 as a mask to expose a surface of the silicon device layer 103 where slanted structures are desired. Over-etch may be reduced and/or minimized to avoid excessive removal of the dry oxide 403 in the trenches 415. In particular, over-etching of the dry oxide 403 in the trenches 415 may affect the protection of convex corners for the electrodes 420 at the device edge 1220, leading to a larger undercut after the wet-etching operations. For uncontrollable over-etching, a non-rectangular mask can be used to reduce or eliminate undesired effects. Slanted electrodes 430 that are embedded in the bulk structure 1210 (also referred to herein as top electrodes or embedded slanted electrodes 430) may present some fabrication challenges and provide limited transduction area, while the slanted electrodes 420 at the edge 1220 may provide higher efficiency and may be easier to fabricate.

The photoresist mask PR3 is removed, and as shown in FIGS. 14A-14J, an anisotropic wet-etching is performed, resulting self-confined slanted (111) sidewalls 120. Depending on the applications and design, slanted structures can be created either embedded in the bulk structure 1210 of the device, and/or at the edge 1220 of the device.

Figure 14H:
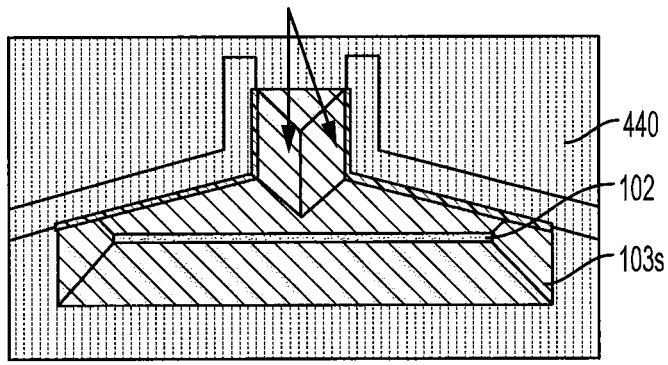

FIGS. 14A-14J depict the formation of slanted structures in accordance with embodiments of the present disclosure. In FIG. 14A, cross-section A-B corresponds to the bulk structure 1210, and cross-section C-D corresponds to the device edge 1220. FIG. 14B is a perspective view of the bulk structure 1210 before forming a slanted top electrode 430 therein, while FIG. 14C is a perspective view of the edge 1220 before forming a slanted electrode 420 therein. FIGS. 14D and 14E are top or plan views illustrating the wet etching operations for defining slanted top electrodes 430 in the bulk structure 1210, while FIGS. 14F-14J are top or plan views illustrating the wet etching operations for defining slanted electrodes 420 at the edges 1220.

In FIGS. 14D-14E, a wet-etching opening is exposed by the TEOS layer 440 above the bulk structure 1210 of the device. As shown in FIGS. 14A1, 14D, and 14E, in forming the embedded slanted electrode 430, a timed wet-etching results in a wet-etched (100) pit confined by four (111) planes, as shown in FIG. 14E. A slanted electrode 430 that is subsequently defined by a formation of a polysilicon layer 405 in the pit provides a transduction area with opposing slanted surfaces 103e, where slanted surfaces opposite one another have opposite quadrature tuning effects. This time insensitive structure is favorable when all the (111) planes are used for capacitive transduction, such as in accelerometer applications.

However, in some cases, only one side of the slanted surface may be desired. For example, in quadrature tuning applications for out-of-plane gyroscopes, the opposite (111) planes have opposite tuning effects, and including opposing slanted surfaces 103e may cancel out the tuning effect. In such cases, the slanted top electrode 430 may be patterned to cover only half of the pit, as shown in region 1210 of FIG. 24. In order to achieve reliable electrode patterning, a flat (100) region 103f in the wet-etched pit may be used to reduce reflection errors in subsequent lithography operations. This may make fabrication of embedded slanted electrodes 430 more challenging, as the flat (100) region 103f typically requires well-controlled timed anisotropic wet-etching. In addition, with the flat (100) region 103f occupying a relatively large portion of the opening area, the effective slanted transduction area for the (111) surfaces is limited.

As such, slanted structures can additionally or alternatively be formed at the edge 1220 of the device 100. As shown in FIGS. 14A2 and 14F-14J, in forming the slanted electrodes 420 in accordance with some embodiments of the present disclosure, a wet-etching opening is exposed by the TEOS layer pattern 440 above the edge 1220 of the device. At the device edge 1220, the wet-etching region overlaps with the vertical trenches 415 that were refilled with TEOS 440 in FIG. 11. On the device side C, the TEOS layer pattern 440 forms a concave region 440c that defines the edges of the slanted surfaces 103s. On the electrode anchor side D, the TEOS layer pattern 440 overlaps with the TEOS-filled trenches 415 and forms a convex outline 440d.

Figure 14I:
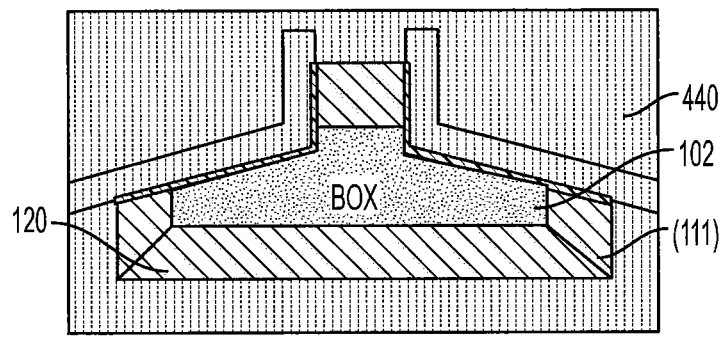
Figure 14J:
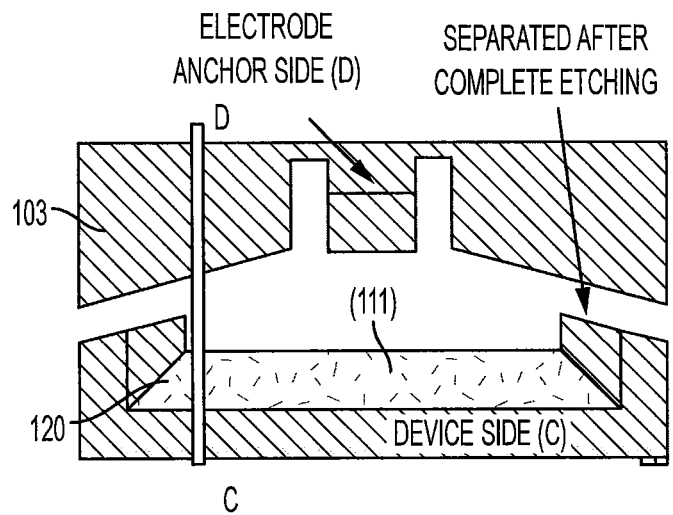

During the wet-etching to form the mold for the slanted electrodes 420 as shown in FIGS. 14G, 14H, and 14I, the (100) plane of the silicon device layer 103 is etched-down, and a (111) surface 120 of the silicon device layer 103 is exposed on the concave side 440c, whereas the convex corners are etched on side 440d. The thermal oxide 403 and TEOS 440 thus form a boundary for silicon wet-etching, and define the final geometry together with the mask opening. In FIG. 14I, the structure is defined by the (111) silicon plane 120, the oxide 403/TEOS 440 sidewall, and the bottom BOX layer 102. The etching is self-confined and the device and electrode anchor are separated through convex corner propagation. As shown in FIG. 14J, the silicon device layer 103 is fully etched to separate the device and the electrode pad. Such wet-etching to define the slanted area 120 and separate the device 100 from the electrode 420 may be less sensitive to etching time, and may define a larger slanted area 120 with stiffer electrodes. In some embodiments, potassium hydroxide (KOH) is used as the main etchant for its high (111) plane selectivity. A short tetramethylammonium hydroxide (TMAH) etching can be used (following the KOH etching) to reduce or eliminate debris and smoothen the slanted surface 120.

For the slanted structure 120 at the device edge 1220, different trench shapes and wet-etching openings may be used as the wet-etching boundary. FIGS. 31A-31B, 32A-32B, and 33A-33B show top views of three such different trench shapes with rectangular openings. In FIGS. 31A, 32A, and 33A, respective wet-etching openings 31, 32, and 33 are exposed by the TEOS layer pattern 440 above the edge 1220 of the device. At the device edge 1220, the wet-etching openings 31, 32, and 33 overlap with the vertical trenches 415 that were refilled with TEOS 440 in FIG. 11.

The different wet-etched structures of FIGS. 31A-31B, 32A-32B, and 33A-33B may be used in addition to or as an alternative to the wet-etched structure shown in FIGS. 14F-14J at the device edge 1220. The wet-etched structure of FIGS. 31A-31B uses vertical trenches 415' that extend co-linearly or have a straight profile. However, if the co-linear trenches 415' are slightly misaligned, from the (110) crystal direction of the silicon device layer 103, the final wet-etched structure shown in FIG. 31B may include undesired residuals 31x, which may affect device stability. In the wet-etched structures of FIGS. 32A-32B, the trenches 415" are intentionally angled or sloped, making the final structure shown in FIG. 32B less sensitive to misalignment, and resulting in smaller residuals 32x on the electrode anchor side.

In the wet-etched structures of FIGS. 31A-31B and 32A-32B, the vertical trenches 415' and 415" do not close-up with the wet-etching openings 31 and 32. As a result, the wet-etching may reach the BOX layer 102 on both the device side C and the electrode anchor side D, which may reduce the final electrode stiffness and affect the device breakdown voltage. In contrast, FIGS. 33A-33B illustrate a closed-trench design. In FIGS. 33A-33B, the wet-etching does not reach the BOX layer 102 at the smaller closed regions, which can result in stiffer structures in the slanted polysilicon electrodes formed in the wet-etched structure shown in in FIG. 33B. However, the more complicated topography of FIG. 33B may add challenges to subsequent lithography steps. Compared to the wet-etched structures of FIGS. 31A-31B, 32A-32B, and 33A-33B, the nonrectangular opening wet-etched structure shown in FIGS. 14F-14J may not only be misalignment insensitive, but may also reduce or eliminate unnecessary geometric complexity.

FIGS. 15-25 illustrate operations for top electrode 430 and slanted electrode 420 formation in forming a pitch/roll annulus gyroscope 100 in accordance with some embodiments of the present disclosure. In the examples of FIGS. 15-25, after the wet-etching steps of FIGS. 14A-14J, the top TEOS 440 mask is patterned again to open regions where horizontal/top electrodes 430 are to be formed, and a thermal oxidation of silicon is performed to form sacrificial layer 403" that defines the horizontal/top gap-size (between the top electrodes 430 and the (100) silicon surface in region 1210) and slanted gap-size (between the slanted electrodes 420 and the (111) silicon sidewalls in region 1220). An additional oxidation step can be used before the second mask patterning operation if slanted gap-size is desired that requires longer oxidation time than that of top gap-size. A second polysilicon layer 405 is deposited to cover the wafer 400 conformally. This polysilicon layer 405 is then patterned to form top electrodes 430 and slanted electrodes 420. At last, the device 100 is released (for example, in a hydrofluoric acid (HF) solution) to suspend the movable resonator structure 105 over the substrate 101.

Figure 15:
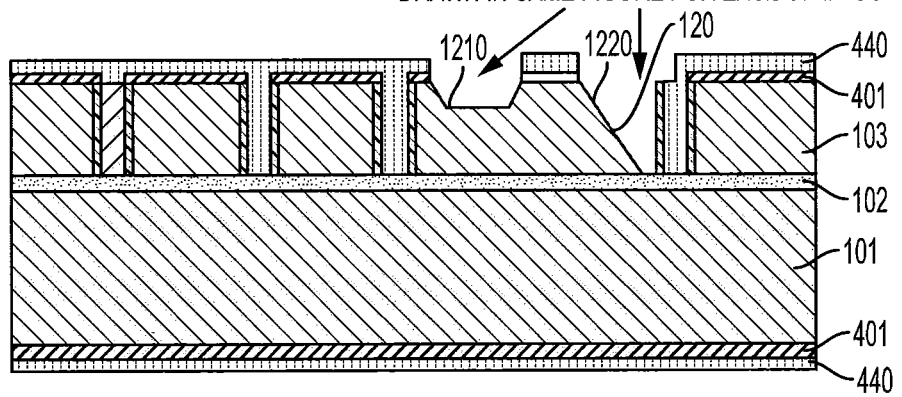

In particular, as shown in FIG. 15, the wet-etched structure is formed by the timed anisotropic wet etch described above with reference to FIGS. 14A-14J. It is noted that the TMAH etching may not substantially etch oxide, but can result in a larger undercut due to lower crystalline selectivity. The KOH etching provides better crystalline selectivity, but slower etching of oxide may lead to small imperfections at protected convex corners. FIG. 15 illustrates the bulk portions 1210 and edge portions 1220 after different etching times, which are shown in the same figure for ease of illustration.

Figure 16:
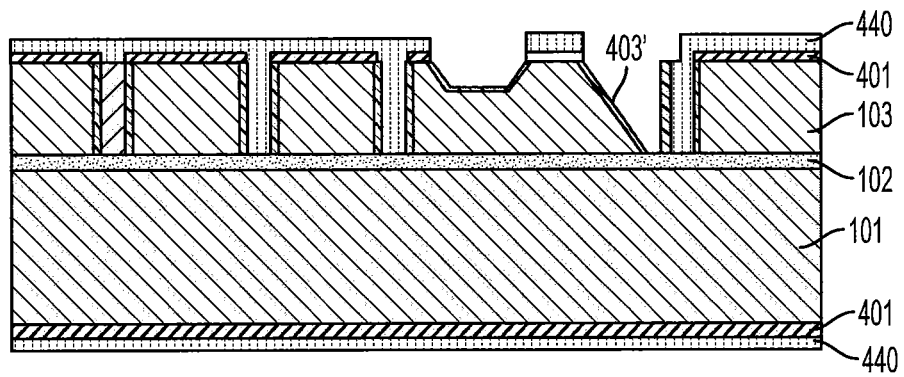

FIG. 16 illustrates fabrication of the slanted electrode gap. As shown in FIG. 16, after the wet-etching of FIGS. 14A-14J, a thin TEOS layer is deposited as a sacrificial oxide (SACOX) layer 403' to define the top electrode gap size 430g and the slanted electrode gap size 420g. In some embodiments, an additional thermal oxidation may be performed if formation of the slanted gap size 420g requires a longer oxidation than formation of the top gap size 430g; however, if the same oxidation time can be utilized for both gap sizes 420g and 430g, the additional thermal oxidation may be omitted.

Figure 17:
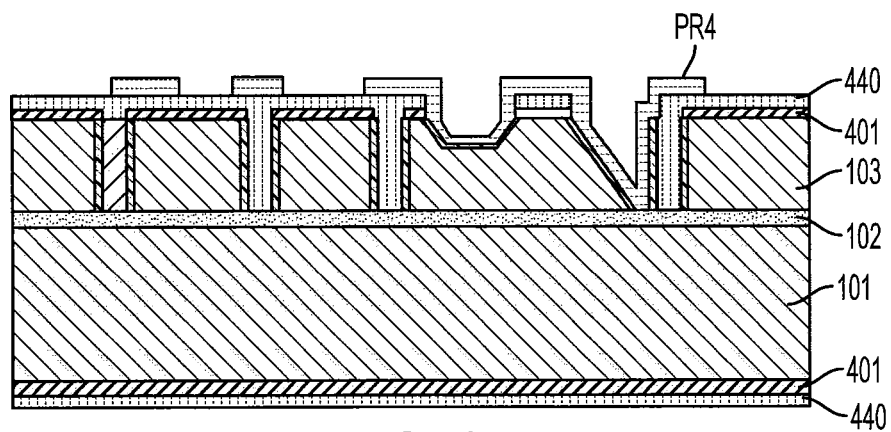

As shown in FIG. 17, the TEOS layer 440 is patterned by forming a photoresist pattern PR4 on the TEOS layer 440. The photoresist pattern PR4 may be formed by spray-coating a photoresist layer (to ensure coverage of slanted surface 420) and patterning the photoresist layer to expose areas of the TEOS layer 440 corresponding to portions of the top electrodes and center support regions. The lithography recipe may be modified to achieve a desired resolution for spray-coated photoresist layer.

Figure 18:
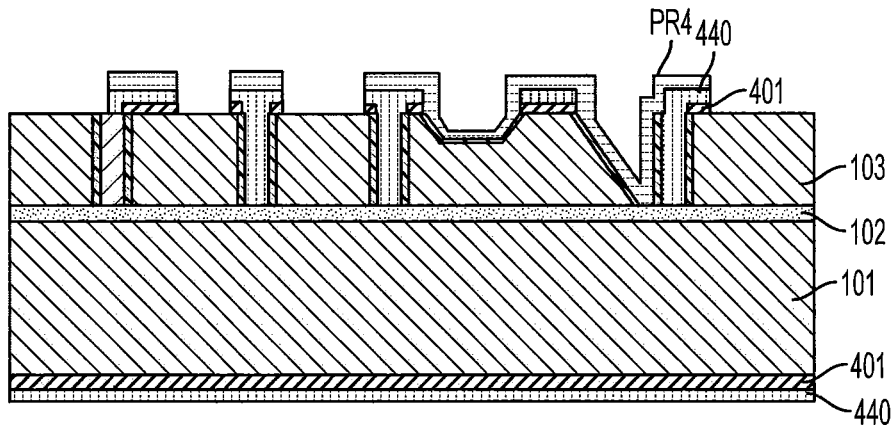

As shown in FIG. 18, the TEOS layer 440 is etched to expose the surface of the silicon device layer 103. Care is taken so as not to over-etch the silicon device layer 103, thereby maintaining a desired silicon thickness.

Figure 19:
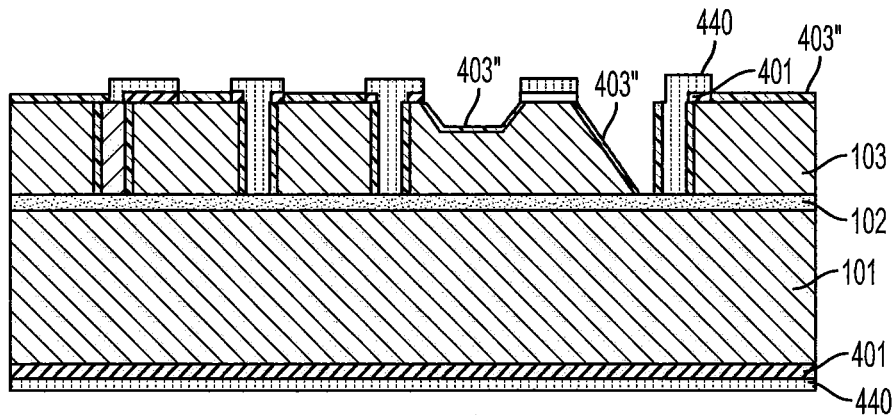

As shown in FIG. 19, the top electrode gap 430g and the slanted electrode gap 420g are defined. In particular, the photoresist pattern PR4 is removed, the wafer 400 is cleaned, and a thermal oxide layer 403" is grown on portions of the silicon active layer 130 to define the respective sizes of the top electrode gap 430g and the slanted electrode gap 420g.

Figure 20:
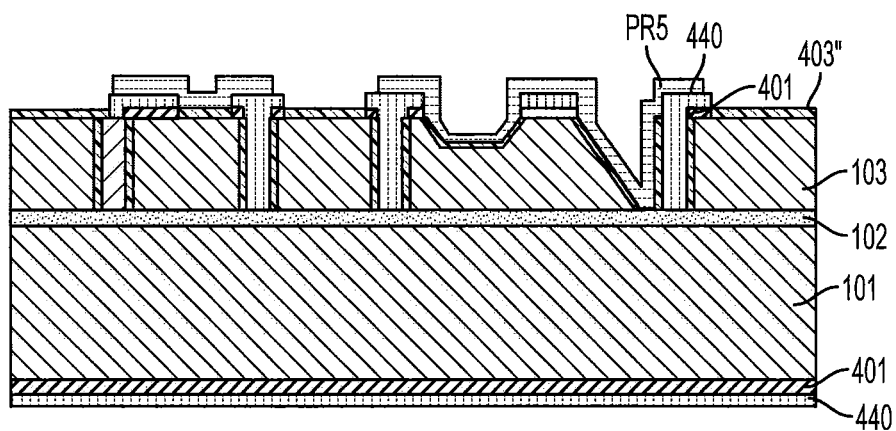

As shown in FIG. 20, a photoresist pattern PR5 is formed on the thermal oxide layer 403" and the TEOS layer 440 to protect regions corresponding to the top electrode gap 430g and the slanted electrode gap 420g. The photoresist pattern PR5 may be formed by spray-coating a photoresist layer (to ensure coverage of slanted surfaces) and patterning the photoresist layer to define the photoresist pattern PR5 exposing portions of the thermal oxide layer 403".

Figure 21:
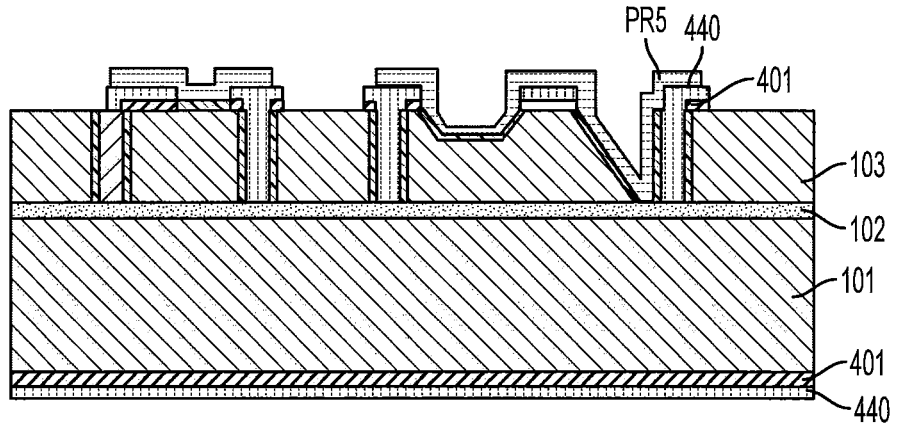

As shown in FIG. 21, the thin thermal oxide layer 403" is etched to expose the surface of the silicon device layer 103 using the photoresist pattern PR5 as an etching mask. Care is again taken so as not to over-etch the silicon device layer 103 to maintain a desired silicon thickness.

Figure 22:
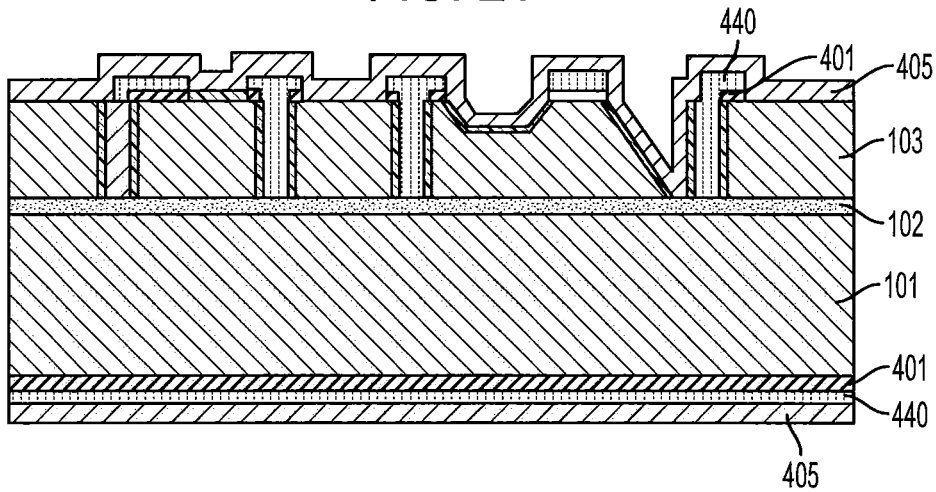

As shown in FIG. 22, a top polysilicon deposition is performed. In particular, the photoresist pattern PR5 is removed, the wafer 400 is cleaned, and a second or top polysilicon layer 405 is deposited. The electrodes 420 and/or 430 described herein are subsequently formed from the top polysilicon layer 405.

Figure 23:
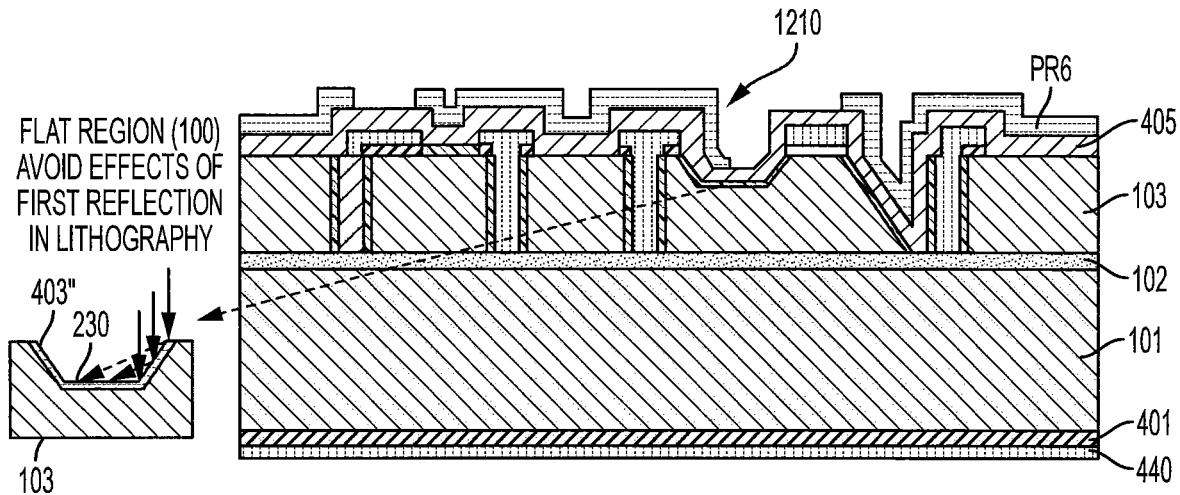

In particular, as shown in FIG. 23, electrode patterning is performed using a photoresist pattern PR6. The photoresist pattern PR6 may be formed by spray coating a photoresist layer, and patterning the photoresist layer to define photoresist pattern PR6 exposing portions of the top polysilicon layer 405. Removal of the portions of the top polysilicon layer 405 that are exposed by the photoresist pattern PR6 is used to separate the electrodes 420 and 430.

As further shown in the enlarged portion of FIG. 23, forming the slanted top electrode 430 above the bulk structure (in region 1210) may involve lithography on a high topography surface. A spray-coated photoresist pattern PR6 may provide better coverage of the wet-etched pit, and therefore may be more suitable than spin-coated photoresist. In some embodiments, forming patterns across the wet-etched pit in region 1210 may be avoided, as 3D lithography may involve inherent imperfections, such as non-uniform resolution on the top and bottom of the pit. In other embodiments where patterning across the wet-etched pit is desired or otherwise needed, factors such as slanted sidewall reflection may be accounted for to achieve improved or optimized lithography results. For example, a flat (100) region or surface 230 between the slanted surfaces in region 1210 may be used to reduce lithography challenges that may be caused by slanted sidewall reflection. The lithography recipe may be improved or optimized to achieve the desired resolution across the wet-etched pit in region 1210. In contrast, the design of the slanted electrode 420 at the edge region 1220 can be configured to avoid high topography lithography.

Figure 24:
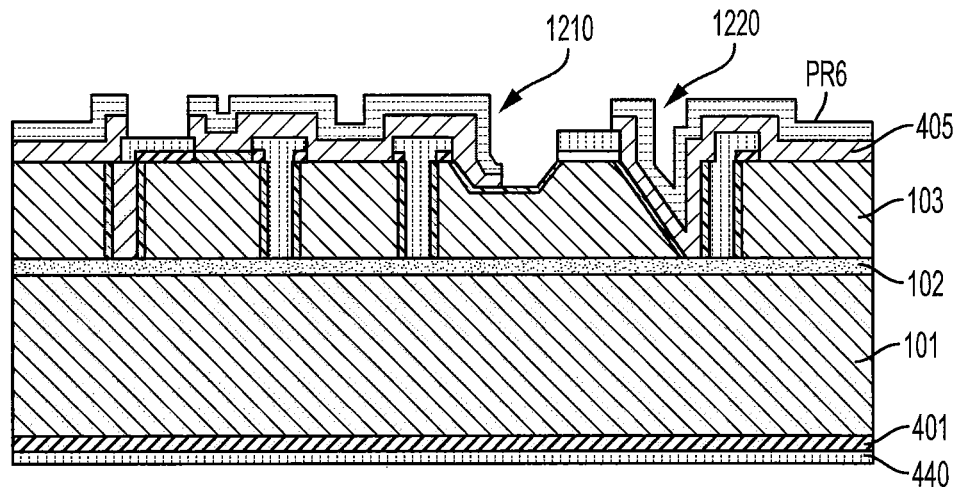
Figure 25:
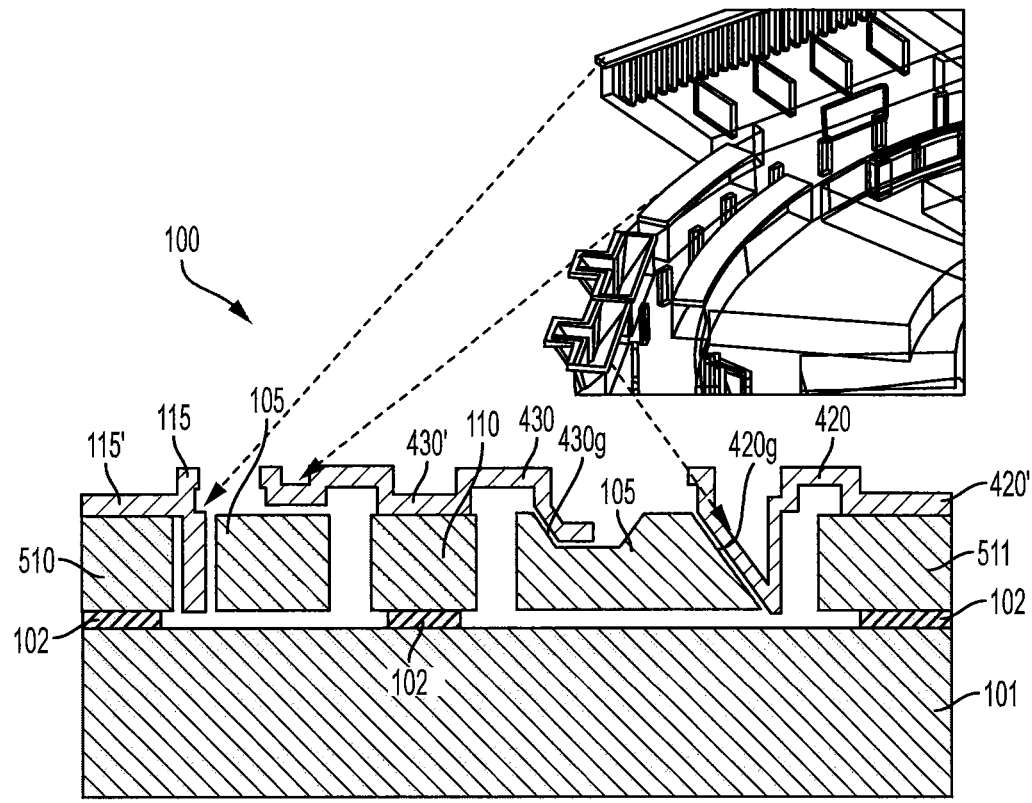

As shown in FIGS. 24 and 25, the top polysilicon layer 405 is patterned to define the top electrode 430 and the slanted electrode 420. In particular, the top polysilicon layer 405 is etched using the photoresist pattern PR6 as a mask to form the electrodes 430 and 420 in regions 1210 and 1220, respectively. FIG. 25 illustrates the release operation whereby the photoresist pattern PR6 is removed, the wafer 400 is cleaned, and the device 100 is released. In particular, a selective etchant is used to remove the oxide layer 403" and the TEOS layer 440. The BOX layer 102 is also selectively removed so as to attach anchor portions 110 and suspend resonator portions 105 of the silicon device layer 103 over the substrate or handle layer 101. In some embodiments, the device 100 may be released in a hydrofluoric acid (HF) solution and/or dried using a super critical dryer.

Upon release, the finished device 100 includes the resonator portion 105 suspended over the substrate 101 by the single crystal silicon (SCS) anchor portion 110, the top electrode 430, the slanted electrode 420, and the vertical (drive) electrode 115. In particular, the SCS anchor portion 110 connects a top portion 430' of the top electrode 430 to a portion of the buried oxide layer 102 on the substrate 101. A SCS anchor portion 510 connects the top portion 115' of the vertical drive electrode 115 to a portion of a buried oxide layer 102 on the substrate 101. A SCS anchor portion 511 connects the top portion 420' of the slanted electrode 420 to a portion of the buried oxide layer 102 on the substrate 101.

Figure 26:
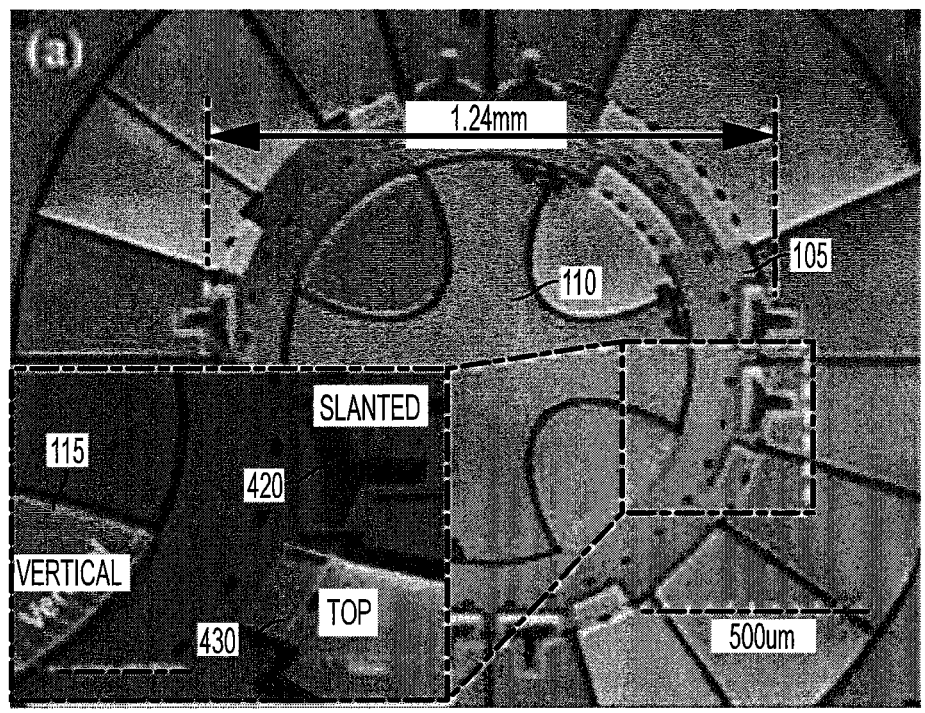
FIG. 26 is a plan view SEM image of the annulus and vertical, top, and slanted electrodes of a pitch/roll annulus gyroscope in accordance with some embodiments of the present disclosure.
Figure 27:
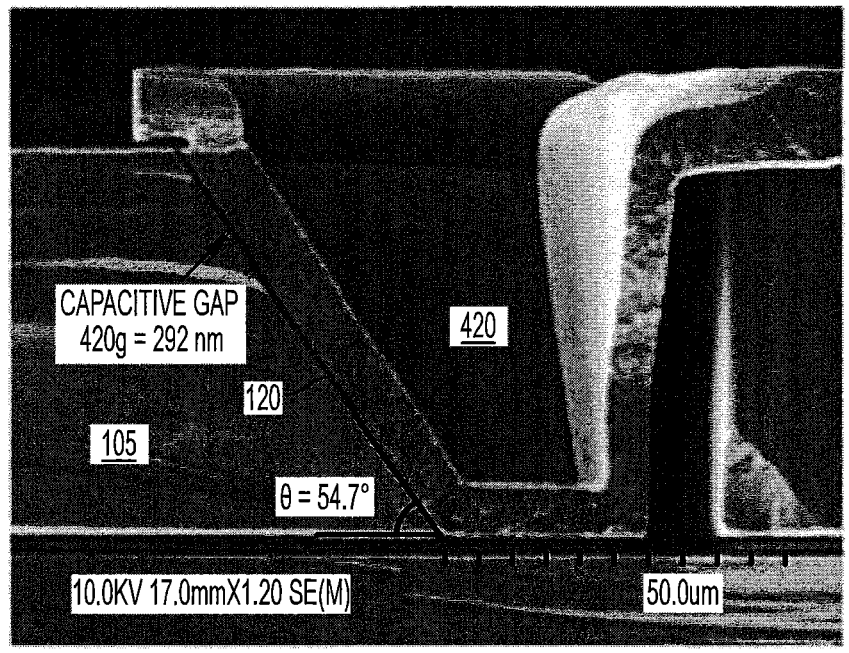
FIG. 27 is a cross-sectional view SEM image of the slanted electrode and slanted sidewall portions of the resonator member of a pitch/roll annulus gyroscope in accordance with some embodiments of the present disclosure.

In particular embodiments, an annulus gyroscope design as described herein may be implemented on a 60 μm SOI wafer using the HARPSS+ process as described herein along with other BAW devices. Electrodes in all three orientations may be formed with approximately 300 nm capacitive gaps. FIGS. 26-27 are SEM images of an example pitch/roll annulus gyroscope fabricated in accordance with some embodiments of the present disclosure. FIG. 26 is a plan view SEM image of the example annulus of a pitch/roll annulus gyroscope. In the example of FIG. 26, the diameter of the annulus is 1.24 mm. The inset image of FIG. 26 is an enlarged top view of three types of electrodes (slanted 420, top 430, and vertical 115). FIG. 27 is a cross-sectional view SEM image of the slanted electrode 420 in the pitch/roll annulus gyroscope of FIG. 26. In FIG. 27, the slanted electrode 420 has a slanting angle θ of about 54.7° (as defined by the (111) crystal plane corresponding to slanted surface 120) and a capacitive gap 420g (between the sidewall of the slanted electrode 420 and the sidewall 120 of the resonator member 105) of about 292 nm.

Figure 28:
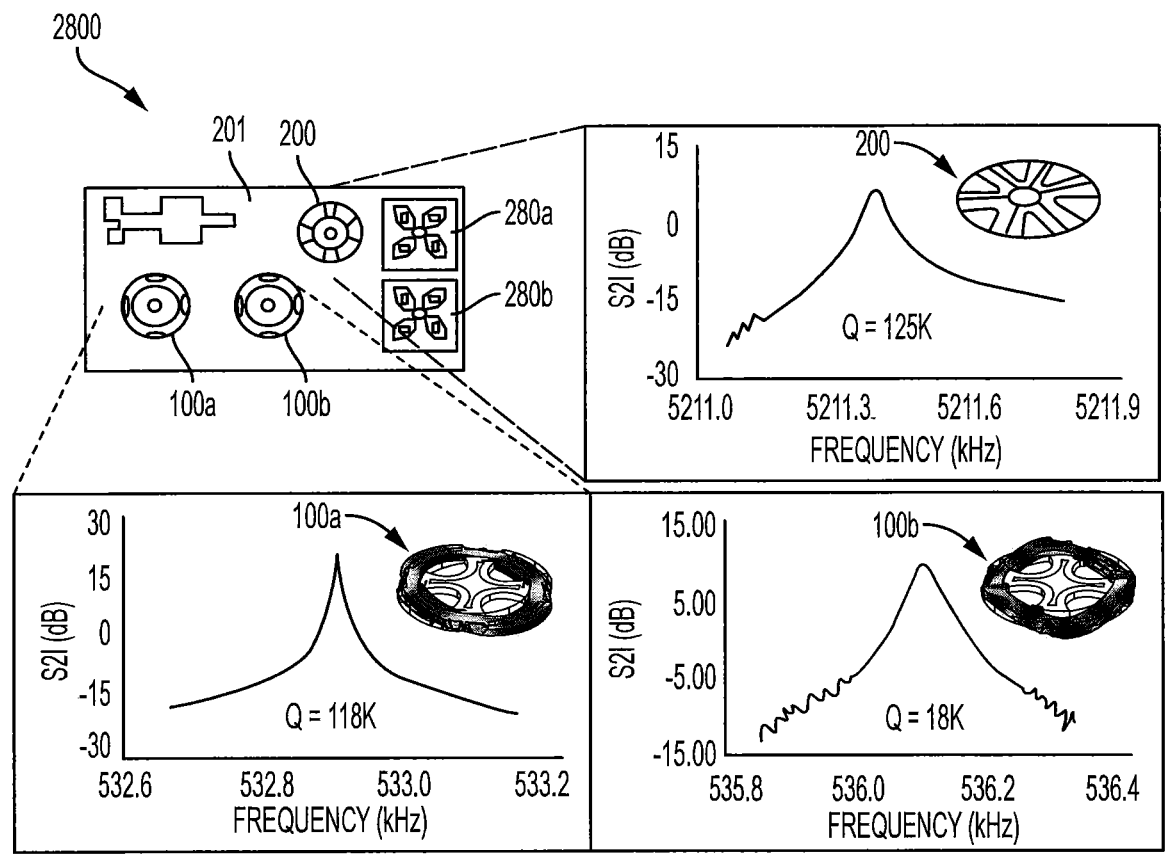
FIG. 28 illustrates measured resonance peaks of a disk yaw gyroscope and pitch/roll annulus gyroscopes fabricated on a 6-DOF IMU die in accordance with some embodiments of the present disclosure.

FIG. 28 illustrates measured resonance peaks of a disk yaw gyroscope and the annulus pitch or roll gyroscope fabricated in accordance with some embodiments of the present disclosure. The HARPSS+ process as described herein allows simultaneous fabrication of multiple degree-of-freedom (DOF) sensors on a single chip. In the example of FIG. 28, a 6-DOF IMU die 2800 was fabricated, which included 3-axis accelerometers 280a, 280b, a BAW disk yaw gyroscope 200, and two pitch or roll annulus gyroscopes 100a, 100b with slanted electrodes in accordance with embodiments as described herein. The operation modes of the gyroscopes 100a, 100b were characterized using a network analyzer. High-frequency gyroscopic modes were measured (for mode m=3), showing resonance peaks at 0.53 MHz for pitch or roll gyroscopes with quality factors Q=118k (for IP mode) and Q=18k (for OOP mode), and at 5.2 MHz for yaw gyroscope with quality factors Q=125k.

That is, FIG. 28 illustrates a single-chip inertial measurement unit (IMU) package 2800 including three gyroscopes 100a, 100b, 200 (one for each degree of freedom in directions along the X-, Y-, and Z-axes), and one or more 3-axis accelerometers 280a, 280b on a common substrate 201. In the example of FIG. 28, the yaw gyroscope 200 is responsive to stimulus along the Z-axis, while the pitch/roll annulus gyroscopes 100a, 100b are rotated 90 degrees relative to one another such that one is responsive to stimulus along the X-axis, and the other is responsive to stimulus along the Y-axis. However, it will be understood that the configuration of the gyroscopes 100a, 100b, and 200 as being responsive to X-, Y- and Z stimuli, respectively, is provided by way of example, and that different configurations are possible in accordance with embodiments of the present disclosure. In some embodiments, the gyroscopes 100a, 100b, 200 and the 3-axis accelerometers 280a, 280b can be simultaneously fabricated on a common silicon-on-insulator (SOI) substrate 201 using HARPSS+ fabrication processes as described herein. Further description of multi-DOF sensors integrated on a single die are provided in the publication "*MULTI-DOF INERTIAL MEMS: FROM GAMING TO DEAD RECKONING*" to F. Ayazi, Digest Tech. Papers Transducers'11 Conference, Beijing, China, pp. 2805-2808, 2011, the disclosure of which is incorporated herein by reference in its entirety.

Figure 29:
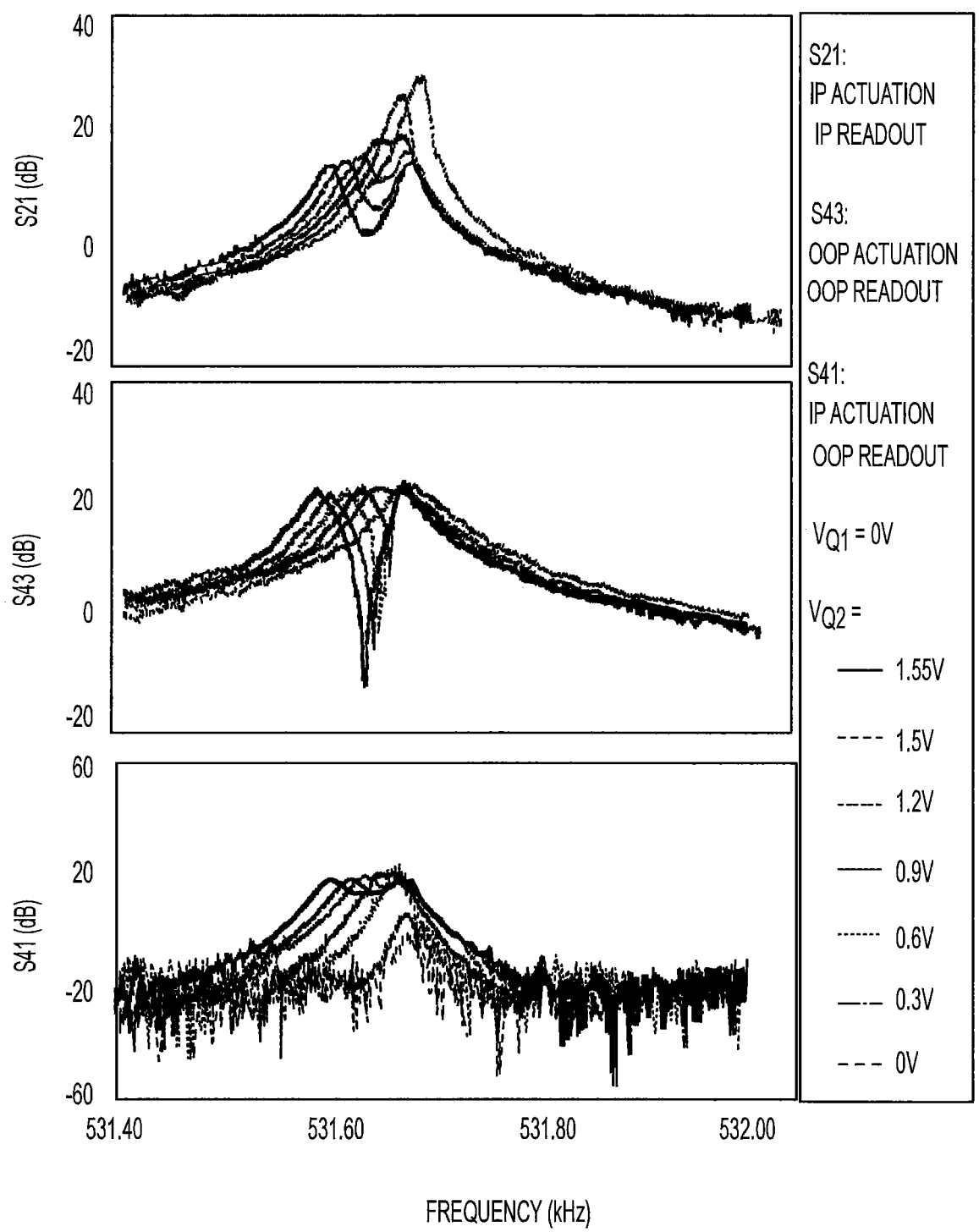
FIG. 29 are graphs illustrating mode-matching in a pitch/roll annulus gyroscope in accordance with some embodiments of the present disclosure.

FIG. 29 illustrates graphs of mode-matching of the annulus gyroscope in accordance with some embodiments of the present disclosure. Mode-matching and performance of the annulus gyroscope is characterized with reference to the electrode configuration shown in FIG. 1. The gyroscope 100 is interfaced with a 4-port network analyzer to capture the quadrature tuning and/or cancellation and mode-matching behavior. The IP loop and OOP loop are connected to separate channels. Direct responses of the two modes (IP and OOP) and indirect response of the sense mode were recorded, illustrated in FIG. 29 by S21 (IP actuation and readout), S43 (OOP actuation and readout) and S41 (IP actuation, OOP readout). Ideally, only one resonance peak should be observed in the direct response of each channel, and no indirect output should be detected. However, in the presence of quadrature, two peaks are observed in each channel with one of them being the cross-coupling peak, and peaks are detected in the indirect response indicating non-zero quadrature level.

Effects of slanted electrodes in accordance with embodiments of the present disclosure can be verified by adjusting both OOP frequency tuning voltage and quadrature tuning voltage with a fixed voltage $V_P$ applied to the anchor structure 110. In the following examples, $V_P$ is fixed at 19V. The OOP tuning voltage $V_{DC1}$ is adjusted to reduce the frequency-split until a minimum split is observed due to the veering effect. This minimum frequency-split exists without quadrature tuning. The quadrature tuning voltages $V_{DC3}$, $V_{DC4}$ are then adjusted to reduce the quadrature level measured from the indirect response. With the new quadrature tuning voltage, the OOP tuning voltage $V_{DC1}$ is re-adjusted to balance the non-identical frequency tuning given in equation (2). By repeating this procedure, the quadrature level is reduced or minimized, and the frequency-split is reduced or eliminated. That is, responsive to quadrature tuning as described herein, mode-matching is achieved. In the example shown in FIG. 1, optimized operating voltages were found to be $V_P$=19V, $V_{DC1}$=1.28V, $V_{DC4}$=1.55V, and $V_{DC2}$=$V_{DC3}$=0V. It is understood that these operating voltages are specific to the example shown in FIG. 1, and that embodiments of the present inventive concepts are in no way limited to such operating voltages.

Figure 30:
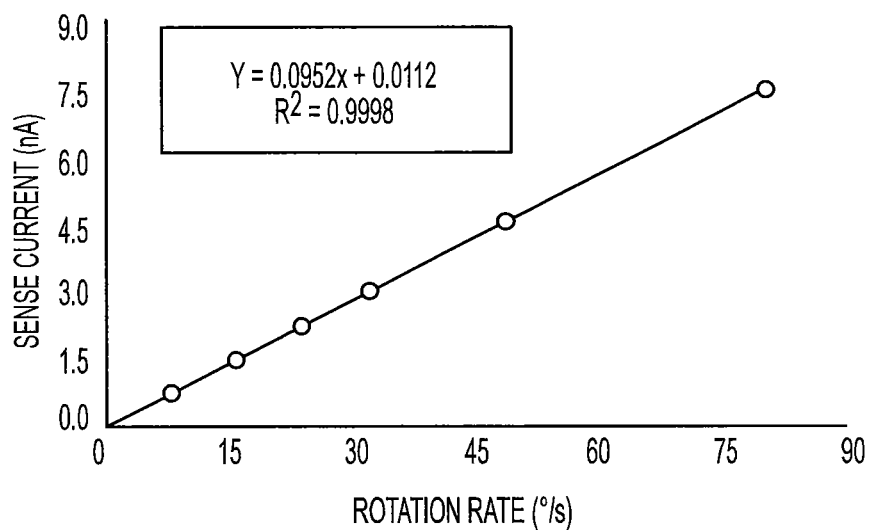
FIG. 30 is a graph illustrating measured rate response of the mode-matched annulus gyroscope in accordance with some embodiments of the present disclosure.

FIG. 30 is a graph illustrating rate response of a mode-matched pitch/roll annulus gyroscope in accordance with some embodiments of the present disclosure. In the example of FIG. 30, the pitch/roll annulus gyroscope was interfaced with a lock-in amplifier 2900 (such as an HF2LI lock-in amplifier; see FIG. 1) for gyroscope operation. The drive mode was actuated into oscillation with an amplitude of about 30 nm. Tuning voltages were optimized for mode-matched operation, as discussed above. As shown in FIG. 30, the angular rate response of the mode-matched pitch/roll annulus gyroscope shows a scale-factor of about 95.2 pA/(°/s) with an open-loop bandwidth of about 15 Hz. The gyroscope 100 may be expected to reach a theoretical mechanical noise floor of about 0.015°/s/√Hz using interface electronics with less than about 0.5 pA/√Hz input referred noise. Through design improvements and/or optimizations such as increasing the linear drive amplitude, the noise floor can be further reduced, making it possible to achieve tactical-grade performance with annulus pitch or roll gyroscopes.

As described herein, some embodiments of the present disclosure provide a pitch or roll annulus gyroscope with slanted quadrature tuning electrodes having an operating frequency of about 0.5 MHz or more, in which electrostatic quadrature tuning and/or cancellation can be achieved. In some embodiments, rate response of the mode-matched gyroscope may show a scale-factor of 95.2 pA/(°/s) with an open-loop bandwidth of 15 Hz. Implementation of slanted electrodes in DRIE-fabricated devices provides ways to overcome obstacles in pitch/roll gyroscope development, and brings potential to future pitch/roll gyroscope designs. The HARPSS+ process according to embodiments of the present disclosure is compatible with conventional BAW devices, and is feasible for single-chip multi-DOF sensors fabrication, and thus for the manufacture of high-performance single-chip IMUs.

Crystallographic orientations according to some embodiments of the present disclosure is described herein with reference to Miller indices. As used herein, Miller indices in square brackets, such as [100], denote a direction, while Miller indices in angle brackets or chevrons, such as <100>, denote a family of directions that are equivalent due to crystal symmetry. For example, <100> refers to the [100], [010], [001] directions and/or the negative of any of these directions, noted as the [$\bar{1}$00], [0$\bar{1}$0], [00$\bar{1}$] directions (where negative terms in Miller indices are noted with a bar over the number that is negative). Miller indices in parentheses, such as (100), denote a plane. The normal to the (100) plane is the direction [100]. Miller indices in curly brackets or braces, such as {100}, denote a family of planes that are equivalent due to crystal symmetry, in a manner similar to the way angle brackets denote a family of directions.

The present inventive concepts have been described with reference to the accompanying drawings, in which embodiments of the inventive concepts are shown. However, the present disclosure should not be construed as limited to the embodiments set forth herein. Rather, these embodiments are provided so that this disclosure will be thorough and complete, and to fully convey the scope of the embodiments to those skilled in the art. Like reference numbers refer to like elements throughout.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, steps, elements, and/or components, but do not preclude the presence or addition of one or more other features, steps, elements, components, and/or groups thereof. As used herein, the term "and/or" includes any and all combinations of one or more of the associated listed items, and may be abbreviated as "/."

It will also be understood that when an element is referred to as being "on," "coupled to," "connected to," or "responsive to" another element, it can be directly "on," "coupled to," "connected to," or "responsive to" the other element, or intervening elements may be present. In contrast, when an element is referred to as being "directly on," "directly coupled to," "directly connected to," or "directly responsive to" another element, there are no intervening elements present. It will also be understood that the sizes and relative orientations of the illustrated elements are not shown to scale, and in some instances they have been exaggerated for purposes of explanation.

Spatially relative terms, such as "above," "below," "upper," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly. Well-known functions or constructions may not be described in detail for brevity and/or clarity.

It will be understood that, although the terms "first," "second," etc. may be used herein to describe various elements, these elements should not be limited by these terms. These terms are only used to distinguish one element from another. Thus, a first element could be termed a second element without departing from the teachings of the present embodiments.

Embodiments are described herein with reference to cross-sectional and/or perspective illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which these embodiments belong. It will be further understood that terms, such as those defined in commonly-used dictionaries, should be interpreted as having a meaning that is consistent with their meaning in the context of the relevant art and will not be interpreted in an idealized or overly-formal sense unless expressly so defined herein.

The foregoing is illustrative of the present disclosure and is not to be construed as limiting thereof. Although a few exemplary embodiments have been described, those skilled in the art will readily appreciate that many modifications are possible in the exemplary embodiments without materially departing from the teachings and advantages of the inventive concepts. Accordingly, all such modifications are intended to be included within the scope of the inventive concepts as defined in the claims.

That which is claimed:

1. A bulk acoustic wave resonator apparatus, comprising:
    a resonator member having an annulus shape; and
    at least one anchor structure coupling the resonator member to a substrate,
    wherein a perimeter of the resonator member is at least partially defined by respective sidewalls that are slanted at an angle of about 30° to about 60° relative to a surface of the resonator member adjacent the substrate.

2. The apparatus of claim 1, wherein the resonator member comprises single crystal silicon, wherein the surface of the resonator member comprises a (100) crystal plane, and wherein the respective sidewalls comprise a (111) crystal plane.

3. The apparatus of claim 1, further comprising:
    respective tuning electrodes disposed adjacent the respective sidewalls of the resonator member and separated therefrom by respective capacitive gaps, wherein portions of the respective tuning electrodes are slanted at respective angles that are parallel to the angle of the respective sidewalls of the resonator member to define the respective capacitive gaps therebetween.

4. The apparatus of claim 3, wherein the perimeter of the resonator member is further defined by a sidewall area that is substantially orthogonal to the surface thereof, and further comprising:
    at least one drive electrode disposed adjacent the sidewall area and configured to actuate movement of the resonator member responsive to application of a voltage thereto.

5. The apparatus of claim 4, wherein, responsive to application of respective voltages thereto, the respective tuning electrodes are configured to produce a corresponding electrostatic force that provides a torque to the resonator member in a direction between an in-plane direction that is parallel to a surface of the substrate and an out-of-plane direction that is orthogonal to the in-plane direction; and/or
    wherein, responsive to the application of the respective voltages thereto, the respective tuning electrodes are configured such that a frequency of an in-plane drive mode of the resonator member and a frequency of an out-of-plane sense mode of the resonator member that is orthogonal to the in-plane drive mode are mode-matched.

6. The apparatus of claim 4, wherein the respective tuning electrodes and the respective sidewalls are positioned at the perimeter of the resonator member between respective nodal points of an in-plane drive mode and an out-of-plane sense mode of the resonator member, and further comprising:
    respective tether structures coupling the at least one anchor structure to the resonator member at different locations thereof,
    wherein the respective tether structures are coupled to the resonator member adjacent the respective nodal points of the out-of-plane sense mode thereof.

7. The apparatus of claim 3, wherein the at least one anchor structure is positioned within an interior of the annulus shape, wherein the respective tuning electrodes comprise polysilicon, and wherein the respective sidewalls comprising a (111) crystal plane define a mold for the polysilicon.

8. The apparatus of claim 1, wherein the resonator member is a first resonator member of a first gyroscope, and further comprising:
    a second resonator member of a second gyroscope; and
    at least one anchor structure coupling the second resonator member to the substrate adjacent the first resonator member,
    wherein a perimeter of the second resonator member is at least partially defined by respective sidewalls that are slanted at an angle of about 30° to about 60° relative to a surface of the second resonator member adjacent the substrate.

9. The apparatus of claim 8, wherein the first and second gyroscopes are pitch and roll gyroscopes, respectively, and further comprising:
    a yaw gyroscope on the substrate adjacent the first and/or second gyroscopes, wherein the yaw gyroscope, the first gyroscope, and the second gyroscopes are responsive to movement along respective orthogonal axes; and/or
    at least one multi-axis accelerometer on the substrate adjacent the first gyroscope and/or the second gyroscope.

10. A method of fabricating a bulk acoustic wave resonator apparatus, the method comprising:
    forming a resonator member having an annulus shape that is coupled to a substrate by at least one anchor structure, wherein a perimeter of the resonator member is at least partially defined by respective sidewalls that are slanted at an angle of about 30° to about 60° relative to a surface of the resonator member adjacent the substrate.

11. The method of claim 10, further comprising:
forming respective tuning electrodes disposed adjacent the respective sidewalls of the resonator member and separated therefrom by respective capacitive gaps, wherein portions of the respective tuning electrodes are slanted at respective angles that are parallel to the angle of the respective sidewalls of the resonator member to define the respective capacitive gaps.

12. The method of claim 11, wherein the perimeter of the resonator member is further defined by a sidewall area that is substantially orthogonal to the surface thereof, and further comprising:
forming at least one drive electrode disposed adjacent the sidewall area and configured to actuate movement of the resonator member responsive to application of a voltage thereto.

13. The method of claim 12, wherein the resonator member comprises single crystal silicon, wherein the surface of the resonator member comprises a (100) crystal plane, and wherein the respective sidewalls comprise a (111) crystal plane.

14. The method of claim 13, wherein the sidewall area is formed by a reactive ion etching process, and wherein the respective sidewalls are formed by an anisotropic wet etching process, wherein the anisotropic wet etching process comprises forming a thermal oxide as an etching mask that exposes respective surfaces of the single crystal silicon comprising the (100) crystal plane opposite the substrate, and wet etching the surfaces of the single crystal silicon exposed by the thermal oxide to form the respective sidewalls comprising the (111) crystal plane.

15. The method of claim 14, wherein the wet etching uses potassium hydroxide (KOH) as an etchant, or wherein the wet etching exposes a buried oxide layer beneath the surface of the resonator member comprising the (100) crystal plane.

16. The method of claim 14, wherein the reactive ion etching process forms trenches in the single crystal silicon defining the sidewall area of the resonator member, and wherein the anisotropic wet etching process comprises:
responsive to the reactive ion etching process, forming the thermal oxide in one or more of the trenches and to define the etching mask for the wet etching, wherein the respective surfaces of the single crystal silicon exposed by the thermal oxide are between the one or more of the trenches.

17. The method of claim 16, wherein forming the at least one drive electrode comprises forming a first polysilicon layer in the trenches in the single crystal silicon responsive to the reactive ion etching process, and selectively removing the first polysilicon layer from the one or more of the trenches prior to forming the thermal oxide in the one or more of the trenches.

18. The method of claim 17, wherein forming at least one drive electrode and forming the respective tuning electrodes comprises forming a second polysilicon layer on a portion of the first polysilicon layer remaining in at least one of the trenches and along the respective sidewalls comprising the (111) crystal plane responsive to the anisotropic wet etching process, and patterning the second polysilicon layer to define the at least one drive electrode and the respective tuning electrodes.

19. A microelectromechanical resonator, comprising:
an annulus-shaped single-crystal semiconductor resonator member attached to a substrate by at least one anchor, said resonator member having a slanted sidewall that extends along a (111) crystal plane thereof and intersects with a surface of said resonator member that extends along a (100) crystal plane; and
a slanted tuning electrode capacitively coupled to the slanted sidewall.

20. The micromechanical resonator of claim 19, wherein the micromechanical resonator is a bulk acoustic wave pitch/roll gyroscope,
wherein the slanted sidewall comprises respective slanted sidewalls at least partially defining a sidewall area that is substantially orthogonal to the surface of the resonator member
wherein the at least one anchor is within a perimeter of the resonator member defined by the sidewall area,
and further comprising at least one drive electrode disposed adjacent the sidewall area and configured to actuate movement of the resonator member responsive to application of a voltage thereto,
wherein the slanted tuning electrode comprises respective tuning electrodes, which are slanted at respective angles parallel to the respective slanted sidewalls of the resonator member and separated therefrom by respective capacitive gaps, wherein the respective tuning electrodes are configured to provide quadrature error tuning between different resonance modes of the resonator member responsive to application of respective voltages thereto.

* * * * *

UNITED STATES PATENT AND TRADEMARK OFFICE
CERTIFICATE OF CORRECTION

PATENT NO. : 10,921,123 B2
APPLICATION NO. : 16/307169
DATED : February 16, 2021
INVENTOR(S) : Wen et al.

It is certified that error appears in the above-identified patent and that said Letters Patent is hereby corrected as shown below:

In the Specification

Column 1, Line 48: Please correct "f Q" to read -- f·Q --

Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*